United States Patent

Kresch et al.

[11] Patent Number: 6,134,571
[45] Date of Patent: Oct. 17, 2000

[54] IMPLICIT DST-BASED FILTER OPERATING IN THE DCT DOMAIN

[75] Inventors: Renato Kresch; Neri Merhav, both of Haifa, Israel

[73] Assignee: Hewlett-Packard Company, Palo Alto, Calif.

[21] Appl. No.: 09/069,550

[22] Filed: Apr. 29, 1998

[51] Int. Cl.[7] .................................................. G06F 17/10
[52] U.S. Cl. ......................................... 708/321; 382/260
[58] Field of Search ................................... 708/321, 402; 382/250, 260

[56] References Cited

U.S. PATENT DOCUMENTS

| | | | |
|---|---|---|---|
| 5,708,732 | 1/1998 | Merhav et al. | 382/250 |
| 5,832,135 | 11/1998 | Merhav et al. | 382/260 |
| 5,867,598 | 2/1999 | Queiroz | 382/250 |
| 5,933,537 | 8/1999 | Hajjahmad | 382/250 |
| 5,937,098 | 8/1999 | Abe | 382/250 |

OTHER PUBLICATIONS

W. H. Chen and S. C. Fralick, "Image Enhancement using Cosine Transform Filtering," Image Sci. Math. Symp., Monterey, CA, Nov. 1976.
K. N. Ngan and R. J. Clarke, "Lowpass Filtering in the Cosine Transform Domain," Int. Conf. On Commun., Seattle, WA, pp. 37.7.1–.37.7.5, Jun. 1980.
B. Chitprasert and K. R. Rao, Discrete Cosine Transform Filtering, Signal Processing, vol. 19, pp. 233–245, 1990.
J. B. Lee and B. G. Lee, "Transform Domain Filtering based on Pipelining Structure," IEEE Trans. On Signal Processing, vol. SP–10, No. 8, pp. 2061–2064, Aug. 1992.
S. F. Chang and D. G. Messerschmitt, "Manipulation and Compositing of MC–DCT Compressed Video," IEEE J. Selected Areas in Communications, vol. 13, No. 1, pp. 1–11, Jan. 1995.
A. Neri, G. Russo, and P. Talone, "Inter–block Filtering and Downsampling in DCT Domain," Signal Processing: Image Communications, vol. 6, pp. 303–317, 1994.
K. R. Rao and P. Yip, Discrete Cosine Transform: Algorithms, Advantages, Applications, Academic Press, 1990, Chapter 2.
Y. Arai, T. Agui, and M. Makajima, "A Fast DCT–SQ Scheme for Images," Trans. Of the IEICE, E 71(11):1095, Nov. 1998.
S. A. Martucci, "Symmetric Convolution and Discrete Sine and Cosine Transforms", SP–42 IEEE Trans. Of Signal Processing, pp. 1038–1051, May 1994.
W. B. Pennebaker and J. L. Mitchell, JPEG Still Image Data Compression Standard, Van Nostrand Reinhold, 1993, Chapter 4.

*Primary Examiner*—David H. Malzahn

[57] ABSTRACT

An implicit DST-based filter having characteristics defined by a linear convolution kernel that may be causal or noncausal-symmetric. The filter filters an information signal composed of blocks of discrete cosine transform (DCT) coefficients to generate a filtered information signal also composed of blocks of DCT coefficients. The filter comprises multiplying matrices, a deriving module, matrix multiplying modules and a summing module. The multiplying matrices are obtained by absorbing a cosine-to-sine transform and a sine-to-cosine transform into kernel matrices derived from the linear convolution kernel. The deriving module derives intermediate blocks of DCT coefficients from neighboring ones of the blocks of DCT coefficients constituting the information signal. The matrix multiplying modules multiply the intermediate blocks of DCT coefficients by the multiplying matrices. The summing module sums the blocks of DCT coefficients generated by the matrix multiplying modules to generate the blocks of DCT coefficients constituting the filtered information signal.

25 Claims, 10 Drawing Sheets

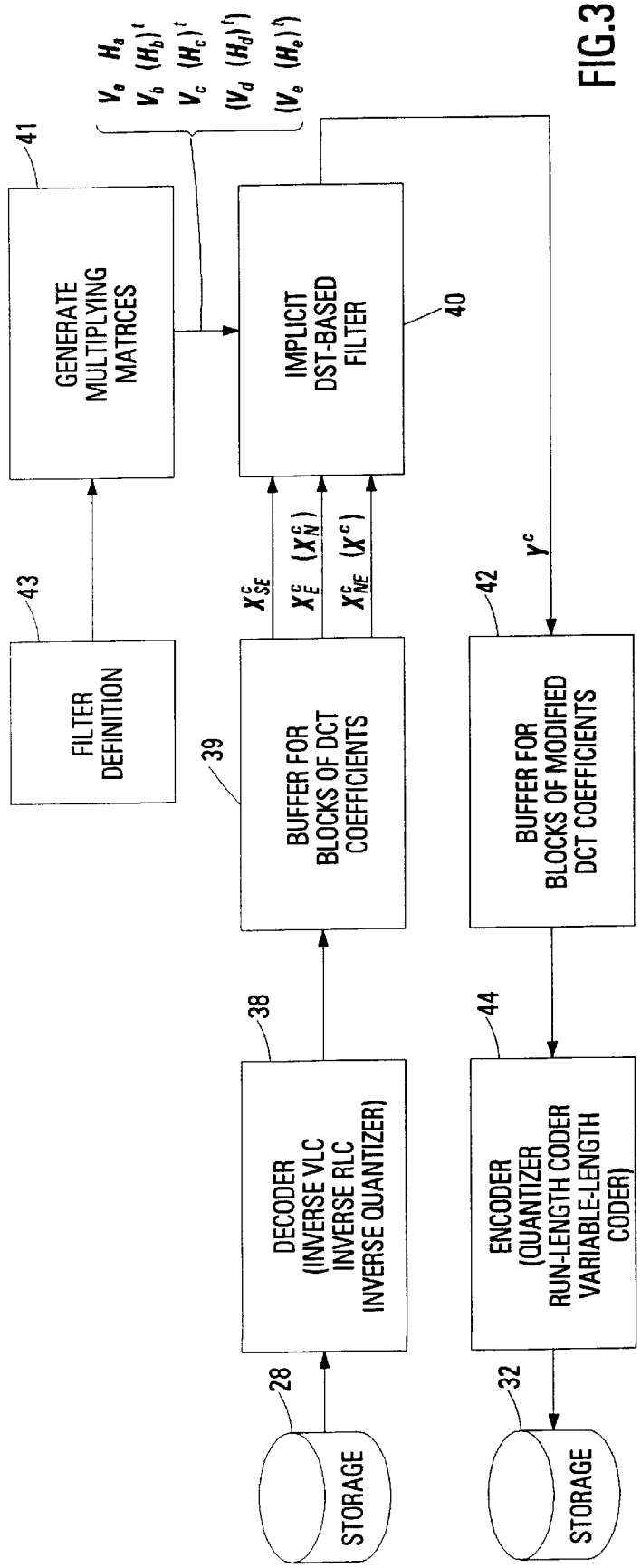
FIG. 3
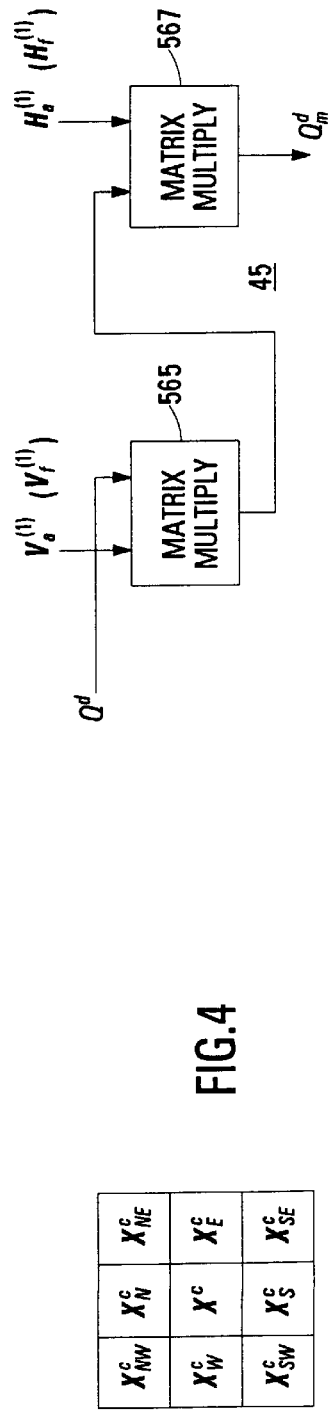
FIG. 14
FIG. 4

IMPLICIT DST-BASED FILTER OPERATING IN THE DCT DOMAIN

FIELD OF THE INVENTION

The invention relates generally to an apparatus and method for processing picture signals, and more particularly to an apparatus and method operating in the discrete cosine transform (DCT) domain for performing spatial filtering on compressed signals representing still and moving pictures.

BACKGROUND OF THE INVENTION

In the following description, references to picture signals will be understood to encompass information signals that represent still or moving pictures. Conventionally, spatial filtering is applied to picture signals in the spatial domain. The term spatial filtering as used in this disclosure refers to any operation performed by means of a linear convolution between an information signal and a linear convolution kernel.

In recent years, a number of efficient ways of compressing picture signals have been developed, and reductions in the cost of computers and digital signal processors have brought practical implementations of such compression schemes with the budgets of both the consumer and the professions. Compressing the picture signal reduces the amount of storage capacity required to store the picture signal or reduces the transmission bandwidth required to transmit the picture signal. A spatial filter designed to filter picture signals in the spatial domain will not produce the desired results when applied directly to compressed picture signals. A different approach is required to apply spatial filtering to compressed picture signals.

One approach is to expand the compressed picture signal to the spatial domain, apply the spatial filtering in the spatial domain using a conventional spatial domain filter, and re-compress the filtered picture signal. This approach will be called the straightforward approach. A block diagram of the straightforward approach is shown in FIG. 1. Initially, a compressed picture signal representing a still or moving picture is stored on a disk 12. Alternatively, the picture signal may be received via a communication link or some other means. The picture signal is compressed using one of any number of industry standard compression schemes, for example, JPEG, MPEG, H.261 or H.263. Many of the standard compression schemes use an orthogonal transform, such as a discrete cosine transform (DCT), to convert the blocks of picture data constituting the picture signal from the spatial domain to the frequency domain. The resulting blocks of DCT coefficients have substantially fewer DCT coefficients of a significant magnitude than the number of elements of significant magnitude in the original blocks of picture data. This is especially true when the original block of picture data represents part of the picture lacking in spatial detail. Consequently, orthogonally transforming the blocks of picture data and quantizing the resulting transform coefficients compresses the picture data, since fewer bits are required to represent the quantized DCT coefficients than are required to represent the original picture data.

Applying a DCT to two-dimensional 8×8 blocks of picture data converts the block $\{x(n,m)\}$ in the spatial domain into a corresponding matrix of DCT coefficients $\{X(k,l)\}$ in the frequency domain according to the following equation:

$$X(k,l) = \frac{c(k)}{2}\frac{c(l)}{2}\left[\sum_{n=0}^{7}\sum_{m=0}^{7}x(n,m)\cos\left(\frac{(2n+1)k\pi}{16}\right)\cos\left(\frac{(2m+1)l\pi}{16}\right)\right]$$

where $c(k)=1/\sqrt{2}$ for $k=0$, and $c(k)=1$ for $k>0$.

Conventional approaches to applying spatial filtering to a picture signal do not operate on the compressed picture signal, i.e., on the blocks of DCT coefficients. Instead, the blocks of DCT coefficients are transformed from the frequency domain back to the spatial domain in step 14. If the compression scheme uses a discrete cosine transform, the expansion scheme uses an inverse discrete cosine transform defined by the following equation:

$$x(n,m) = \sum_{k=0}^{7}\sum_{k=0}^{7}\frac{c(k)}{2}\frac{c(l)}{2}X(k,l)\cos\left(\frac{(2n+1)k\pi}{16}\right)\cos\left(\frac{(2m+1)l\pi}{16}\right)$$

Once the compressed picture signal has been returned to the spatial domain, the conventional spatial filtering techniques indicated in block 16 can be used to apply the desired spatial filtering to the picture signal. The filtered picture signal is then re-compressed, as indicated in block 18. If, after compression, the filtered picture signal is to be compatible with the original compressed picture signal, the filtered picture signal should be re-compressed using the same compression scheme as was used to generate the original compressed picture signal. The compressed filtered picture signal is stored back on the disk 20, or may be transmitted elsewhere without storing it. Although the disks 12 and 20 are shown as separate devices, they can in fact be one and the same.

The problem with the straightforward approach is that it is computationally intensive. As described above, the compressed picture signal must be expanded, spatially filtered, and then re-compressed each time spatial filtering is applied. Savings in the computational resources required to perform such spatial filtering would be achieved if the spatial filtering could be performed on the compressed picture signal, i.e., if the spatial filtering could be performed on the blocks of DCT coefficients constituting the compressed picture signal. This would allow the expansion and re-compression processing performed by blocks 14 and 18, respectively, to be eliminated. This approach would only be desirable, however, if performing the spatial filtering in the DCT domain required fewer computational resources than those required by the conventional approach.

Past work on spatial filtering in the DCT domain has largely concentrated on convolution-multiplication properties (CMP's) of the DCT, and by analogy to the well-known CMP of the discrete Fourier transform (DFT). In *Image Enhancement Using Cosine Transform Filtering*, IMAGE SCI. MATH. SYMP., Monterey, Calif., Nov. 1976, W. H. Chen and S. C. Fralick showed that coefficient-by-coefficient multiplication in the DCT domain corresponds to circular convolution of three time domain (or spatial domain) sequences. One of these sequences is a fixed undesired sequence that can be eliminated by an appropriate modification of the DCT domain filter coefficients. In *Low-Pass Filtering in the Cosine Transform Donain*, INT. CONF. ON COMMUN., Seattle, Wash., pp. 37.7.7.1–37.7.5, June 1980, K. N. Ngan and R. J. Clark applied this property to low-pass filtering images. Others have simplified significantly the CMP of Chen and Fralick. For example, see B. Chitpraset and K. R. Rao, *Discrete Cosine Transform Filtering*, 19 SIGNAL PROCESSING, 233–245, (1990). Their method, however, is still applicable only to a particular type of convolution known as symmetric convolution rather than to the more desirable linear convolution. It is known that the above-mentioned symmetric convolution causes block edge artifacts. More recently, in *Symmetric Convolution and Discrete Sine and Cosine Transforms*, SP-42 IEEE TRANS. ON SIGNAL PROCESSING, 1038–1051, (1994 May), S. A. Martucci described a complete set of symmetrical/antisymmetrical convolution routines for a family of discrete trigonometrical transforms, including the DCT. Martucci's method can be modified to obtain a linear convolution by appropriate zero padding in the convolution domain. However, Martucci's method cannot be used directly or efficiently in the above-mentioned DCT-domain spatial filtering applications since the DCT domain data are already given without prior zero padding in the spatial domain.

In *Transform Domain Filtering Based on Pipelining Structure*, SP-40 IEEE TRANS. ON SIGNAL PROCESSING, 2061–2064, (1992 August), J. B. Lee and B. G. Lee described an alternative to the CMP approach that uses a simple algebraic approach to derive a transform-domain linear convolution filter and that can be implemented using a pipeline hardware architecture. The Lee and Lee approach precomputes the product of the operator matrices corresponding to inverse DCT (IDCT), the convolution, and the DCT, and then uses this combined operator matrix directly in the DCT domain. In this, the contributions of neighboring DCT data blocks are incorporated in a way similar to that of the overlap and add (OLA) method, In *Manipulation and Compositing of MC-DCT Compressed Video*, 13 IEEE J. SELECTED AREAS IN COMMUNICATIONS, 1–11 (1995 January), S. F. Chang and D. G. Messerschmitt proposed a similar approach by using the distributive property of the DCT with respect to matrix multiplication. A more thorough study of this approach, in combination with down sampling, was described by Neri et al. in *Inter-Block Filtering and Down Sampling in DCT Domain*, 6 SIGNAL PROCESSING: IMAGE COMMUNICATION, 303–317, (1994). The problem with each of these approaches is that they are still relatively computationally intensive, which causes filtering in the DCT domain to be slow.

In U.S. patent application Ser. No. 5,832,135, filed on Mar. 6, 1996, entitled *A Fast Method and Apparatus for Filtering Compressed Images in the DCT Domain*, and assigned to the assignee of the present application, one of the inventors of this application (Merhav) and V. Bhaskharan describe a spatial filter for picture signals that operates in the DCT domain. Matrices obtained by performing a double butterflying operation on the input blocks of DCT coefficients are multiplied by multiplying matrices. The multiplying matrices are obtained by applying a discrete cosine transform to the input kernel matrices and then performing a butterflying operation on the resulting DCT coefficients. This filter has the advantage of being less computationally intense than the approaches described above, especially when the blocks of DCT coefficients are "sparse." In this disclosure, blocks of DCT coefficients are defined as being sparse when most of the DCT coefficients in the block have a value of zero. The reduced computational intensity of the filter arises because the multiplying matrices derived from the input kernel matrices are relatively sparse. However, the characteristics of the filter disclosed by Merhav and Bhaskharan are defined by a noncausal-symmetric kernel only. Moreover, it would be beneficial if the filter could be made to operate more quickly in relevant applications.

It should be noted that the term symmetric is generally used in the art to denote filter kernels that are symmetrical about the origin. Some of the filter kernels described in this disclosure are symmetrical about a point other than the origin, and will be identified by the term causal symmetric. Filter kernels that are symmetric in the conventional sense will be described in this disclosure as non-causal symmetric to distinguish them from causal symmetric filter kernels.

It would be advantageous for the filter characteristics of a spatial filter operating in the DCT domain to be defined by any type of kernel, causal or non-causal; symmetric or non-symmetric. It would also be advantageous if the number of computational operations required to perform the spatial filtering operation to be further reduced, especially when the blocks of DCT coefficients constituting the compressed picture signal subject to the spatial filtering are sparse, as is typically the case.

SUMMARY OF THE INVENTION

The invention provides an implicit DST-based filter having characteristics defined by a linear convolution kernel. The filter filters an information signal composed of blocks of discrete cosine transform (DCT) coefficients to generate a filtered information signal also composed of blocks of DCT coefficients. The filter comprises multiplying matrices, a deriving module, matrix multiplying modules and a summing module. The multiplying matrices are obtained by absorbing a cosine-to-sine transform and a sine-to-cosine transform into kernel matrices derived from the linear convolution kernel. The deriving module derives intermediate blocks of DCT coefficients from neighboring ones of the blocks of DCT coefficients constituting the information signal. The matrix multiplying modules multiply the intermediate blocks of DCT coefficients by the multiplying matrices. The summing module sums the blocks of DCT coefficients generated by the matrix multiplying modules to generate the blocks of DCT coefficients constituting the filtered information signal.

The filter may additionally comprise additional multiplying matrices derived from the kernel matrices, additional matrix multiplying modules in which the quantizing table used to quantize the DCT coefficients is pre- and post-multiplied by the additional multiplying matrices to generate a modified quantizing table, and an inverse quantizer that uses the modified quantizing table to inversely quantize the DCT coefficients in the blocks of DCT coefficients constituting the information signal to generate the blocks of DCT coefficients from which the deriving module derives the intermediate blocks of DCT coefficients.

At least one of the multiplying matrices may be composed exclusively of elements having values of one and zero.

The kernel matrices from which the multiplying matrices are obtained may be derived from a discrete Fourier transform of a vector that exactly represents the linear convolution kernel.

The deriving module may include a module that applies an even-element sign reversal operation to ones of the neighboring ones of the blocks of DCT coefficients constituting the information signal to generate even-element sign-reversed blocks, and a module that performs either a butterflying operation between the even-element sign-reversed blocks, or a butterflying operation between ones of the even-element sign-reversed blocks and ones of the neighboring ones of the blocks of DCT coefficients constituting the information signal.

In a two-dimensional filter, the multiplying matrices may include first multiplying matrices derived from a vertical component of the linear convolution kernel, and second multiplying matrices derived from a horizontal component of the linear convolution kernel. The deriving module may include a first additional deriving module that derives first additional intermediate blocks of DCT coefficients from vertically-neighboring ones of the blocks of DCT coefficients constituting the information signal. The matrix multiplying modules may include first matrix multiplying modules in which the first additional intermediate blocks of DCT coefficients are pre-multiplied by the first multiplying matrices to generate final blocks of DCT coefficients. The deriving module may additionally include an additional summing module in which the final blocks of DCT coefficients generated by the first matrix multiplying modules are summed to generate second additional intermediate blocks of DCT coefficients, and a second additional deriving module that derives the intermediate blocks of DCT coefficients from horizontally-neighboring ones of the second additional intermediate blocks of DCT coefficients. The matrix multiplying modules may include second matrix multiplying modules in which the intermediate blocks of DCT coefficients are post-multiplied by the second multiplying matrices.

The implicit DST-based filter may additionally comprise a multiplying matrix generator that generates the multiplying matrices from the linear convolution kernel. The multiplying matrix generator includes a kernel matrix deriving module and first, second and third matrix multiplying modules. The kernel matrix deriving module derives a first kernel matrix, a second kernel matrix, a third kernel matrix and a fourth kernel matrix from the linear convolution kernel. In the first matrix multiplying module, the first kernel matrix is pre-multiplied by a sine-to-cosine transform matrix and the result is post-multiplied by a cosine-to-sine transform matrix to generate a first further intermediate matrix. In the second matrix multiplying module, the second kernel matrix is post-multiplied by the cosine-to-sine transform matrix to generate a second further intermediate matrix. In the third matrix multiplying module, the third kernel matrix is pre-multiplied by the sine-to-cosine transform matrix to generate a third further intermediate matrix.

When the linear convolution filter is noncausal-symmetric, the multiplying matrix generator additionally includes a multiplying module and first and second summing modules. The multiplying module multiplies the fourth kernel matrix by an integer to generate a first one of the multiplying matrices. The first summing module subtracts the first further intermediate matrix from the fourth kernel matrix to generate a second one of the multiplying matrices. The second summing module adds the second further intermediate matrix to the third further intermediate matrix to generate a third one of the multiplying matrices.

When the linear convolution kernel is causal, the multiplying matrix generator additionally includes first and second summing modules. The first summing module subtracts the third further intermediate matrix from the fourth kernel matrix to generate a first one of the multiplying matrices. The second summing module adds the first further intermediate matrix and the second further intermediate matrix to generate a second one of the multiplying matrices.

BRIEF DESCRIPTION OF THE DRAWINGS

FIG. 3 is a block diagram of a first embodiment of the image/video editor of the system shown in FIG. 2 in which the first and second embodiments of the implicit DST-based filter according to the invention can reside.

FIG. 4 shows the arrangement in the spatial domain of the blocks of DCT coefficients surrounding the current block $X^c$ of DCT coefficients processed by the implicit DST-based filter according to the invention.

FIG. 14 is a block diagram of the quantizing table modifying module shown in FIG. 7.

DETAILED DESCRIPTION OF THE INVENTION

Figure 1:
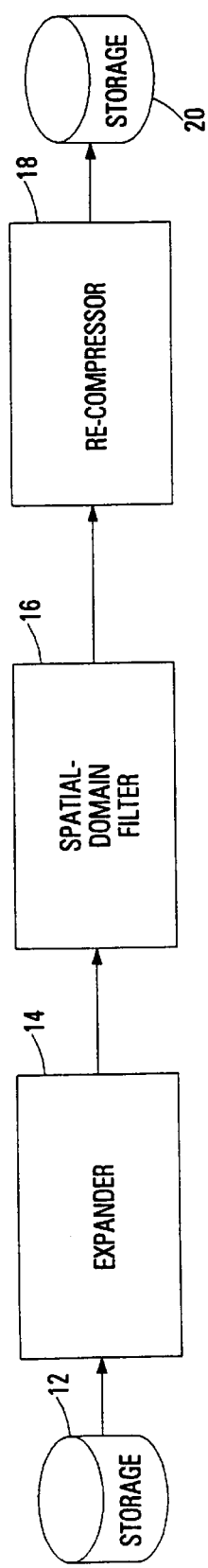
FIG. 1 is a block diagram of the straightforward approach to spatial filtering.

In U.S. patent application Ser. No. 09/069,309, filed on Apr. 29, 1998. entitled Explicit DST-Based Filler Operating in the DCT Domain, the inventors disclose a filter for compressed picture signals that performs spatial filtering using mixed discrete sine transform/discrete cosine transform (DST/DCT) and mixed DCT/DST coefficients derived from the picture data in addition to the DCT coefficients. The idea underlying this approach is that the DST and the DCT together provide the simple convolution-multiplication relationships induced by the discrete Fourier transform (DFT). Since the mixed DST/DCT and DCT/DST coefficients are not part of the picture data, they have to be derived from the DCT coefficients constituting the picture data by subjecting the DCT coefficients to a suitable transform. A spatial filter based on this approach, which will be called an explicit DST-based spatial filter, therefore includes modules that perform fast cosine-sine transforms (CST) and fast sine-cosine transforms (SCT) that directly transform from the DCT to the DST and vice versa.

An explicit DST-based spatial filter approach is highly efficient in the general case, but is less than optimally efficient in the typical case in which the blocks of DCT coefficients are sparse. In this disclosure, a block of DCT coefficients is defined as being "sparse" when most of the DCT coefficients in the block have a value of zero. The explicit approach is less than optimally efficient when the blocks of DCT coefficients are sparse because sparse blocks of DCT coefficients do not necessarily transform into sparse blocks of mixed DST/DCT or mixed DCT/DST coefficients. Nor does sparseness in the DCT domain simplify the CST and the inverse CST, the sine-cosine transform (SCT).

The invention of this disclosure provides an implicit DST-based spatial filter that operates on a compressed picture signal and that is highly efficient in the typical case in which the blocks of DCT coefficients constituting the compressed picture signal are sparse. A first embodiment of the implicit DST-based spatial filter according to the invention increases the computational efficiency of the explicit DST-based spatial filter for sparse blocks of DCT coefficients by merging the cosine-sine transform (CST) operator and the sine-cosine transform (SCT) operator with the convolution, so that only the DCT coefficients are operated upon. A second embodiment of the implicit DST-based filter provides a further increase in computational efficiency. The second embodiment performs a pre-processing operation that alters the quantizing table used to dequantize the quantized DCT coefficients prior to the spatial filtering operation. The quantizing table may form part of the compressed picture signal according to the MPEG or JPEG compression standard, or may be a standard quantizing table. Altering the quantizing table reduces the number of multiplication operations performed by the spatial filter to generate each block of the filtered picture signal.

For each embodiment of the implicit DST-based filter according to the invention, two different embodiments will be described, one for each of two different ways of defining the characteristics of the spatial filter. In the first embodiment, the characteristics of the spatial filter are defined by a noncausal-symmetric kernel. In the second embodiment, the characteristics of the spatial filter are defined by a four-pixel delayed causal-symmetric kernel that will be called, for brevity, a causal-symmetric kernel. The causal-symmetric kernel is a 2-dimensional kernel that is obtained by shifting a causal-symmetric kernel, which is symmetrical about (4, 4), a distance equivalent to four pixels in both the horizontal and vertical directions in the spatial domain. As noted above, a 2-dimensional kernel that is symmetrical about the origin will be called a noncausal-symmetric kernel. As will be shown below, the second embodiment is more computationally efficient than the first.

Before the implicit DST-based filter according to the invention is described in more detail, a system in which the filter can reside will be described with reference to FIG. 2. A preprocessed picture signal 24, which may represent a single, still picture, or may represent a series of pictures, i.e., a motion picture, is compressed by the compression engine 26 according to an appropriate DCT-based compression scheme, e.g., JPEG, MPEG, H.261 or H.263. The picture represented by the picture signal could be a still picture produced by a photoprocessing shop, for example. The compressed picture signal includes blocks of DCT coefficients. The system includes the disk 28 on which the compressed picture signal is stored. The compressed picture signal representing the still picture is then stored on the disk 28 to allow the owner of the picture to edit the picture using the image/video editor 30. The image/video editor 30 includes an implicit DST-based filter according to the invention (not shown in FIG. 2) that operates on the compressed picture signal stored on the disk 28 to produce a filtered picture signal, that is also composed of blocks of DCT-coefficients. The filtered picture signal generated by the image/video editor is stored on the disk 32. The image/video editor 30 can include plural filters according to the invention, each of which has a predefined filter characteristic, and can allow the user to specify which one or more of these filters is desired. Although the disk 32 is shown separately from the disk 28, they can, in fact, be different parts of the same physical disk.

The photoprocessing shop can read the filtered picture signal from the disk 32 and can expand the filtered picture signal using the expansion engine 34 to produce the filtered picture 36 for display on a computer monitor, or for printing, for example.

Figure 2:
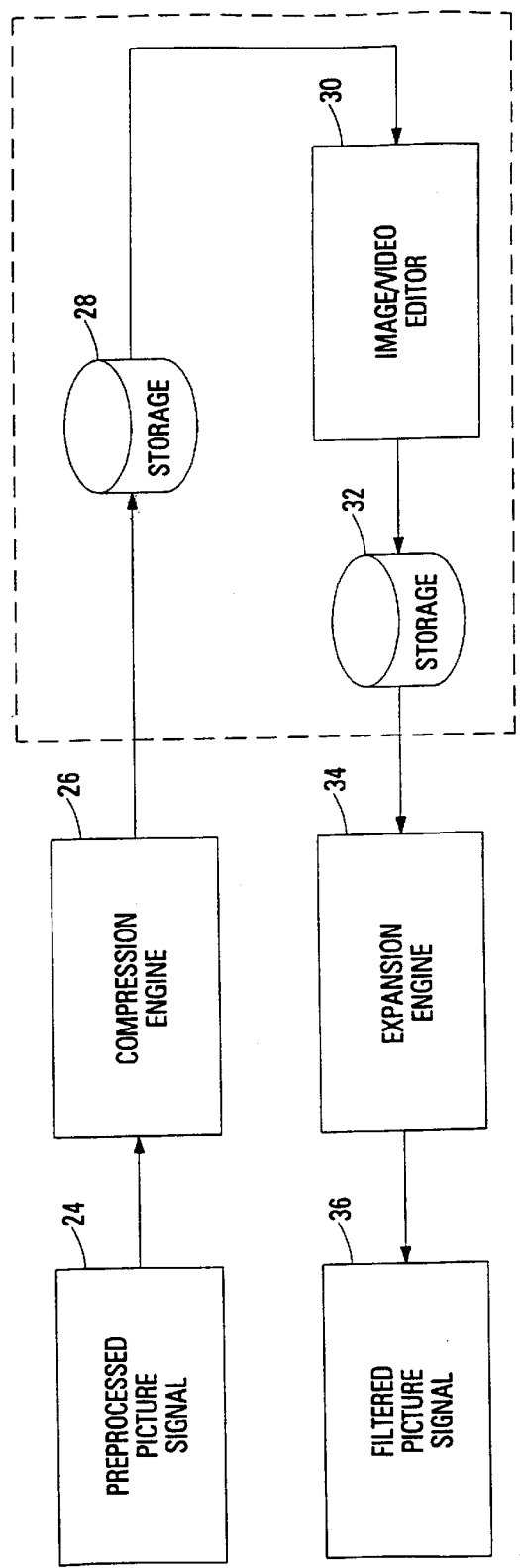
FIG. 2 is a block diagram of an example of a system in which an implicit DST-based filter according to the invention can reside.

FIG. 3 shows a more detailed block diagram of a first embodiment of a image/video editor that may be used as the image/video editor 30 shown in FIG. 2. In this first embodiment, the blocks of quantized DCT coefficients that constitute the compressed picture signal read from the disk 28 are inversely quantized using a quantizing table stored in the picture headers of the compressed picture signal, or using a standard quantizing table that is used in response to a flag bit stored in the picture headers of the compressed picture signal.

The compressed picture signal representing the picture is read out from the disk 28 and fed to the decoder 38. The decoder uses known decoding techniques to reverse the variable-length coding, run-length coding and quantizing that was applied to the DCT coefficients in each block of DCT coefficients when the original picture signal was compressed to generate the compressed picture signal stored on the disk 28. As noted above, the inverse quantizing operation performed by the decoder uses without alteration the quantizing table extracted from the compressed picture signal or the standard quantizing table.

The decoder 38 produces blocks of DCT coefficients and feeds these blocks into the buffer 39 in slice order. The buffer 39 should store the blocks of DCT coefficients constituting at least three slices when the filter characteristic is defined by a noncausal-symmetric kernel, and should store the blocks of DCT coefficients constituting at least two slices when the filter characteristic is defined by a causal-symmetric kernel.

The arrangement in the spatial domain of the blocks of DCT coefficients surrounding the current block $X^c$ of DCT coefficients is shown in FIG. 4. Each of the blocks of DCT coefficients shown in FIG. 4 (e.g., $X^c_{NE}$) is composed of 64 DCT coefficients arranged as an 8×8 matrix. However, the number of DCT coefficients in the blocks is not critical: the blocks of DCT coefficients can be composed of a different number of DCT coefficients.

To generate the filtered picture block $Y^c$ of DCT coefficients corresponding to the current block $X^c$ of DCT coefficients, neighboring blocks of DCT coefficients are read out from the buffer 39 and are passed to the implicit DST-based filter 40 according to the invention. When the filter characteristics are defined by a noncausal-symmetric kernel, the neighboring blocks $X^c_{NE}$, $X^c_E$ and $X^c_{SE}$ of DCT coefficients are passed from the buffer 39 to the filter 40, preferably via the three parallel paths shown. When the filter characteristics are defined by a causal-symmetric kernel, the neighboring block $X^c_N$ and the current block $X^c$ are passed from the buffer to the filter, preferably via the two parallel paths shown.

The implicit DST-based filter 40 has up to three inputs for receiving the neighboring blocks of DCT coefficients, and may include a fourth input for receiving definitions of the multiplying matrices that are used to perform the filtering. The multiplying matrices are pre-calculated by the multiplying matrix generating module 41 in response to a definition of the filter characteristics supplied by the filter definition module 43. The filter may have a single, fixed characteristic or one of multiple, fixed characteristics selected by a user (not shown), or may have a variable characteristic defined by the user. If the filter 40 has a single, fixed characteristic, the modules 41 and 43 may be omitted, and multiplying matrices may be pre-calculated and embodied as hardware in the filter 40, or stored in a suitable non-volatile memory, such as one of the disks 28 and 32. If the filter 40 has a one of multiple, fixed characteristics, the multiplying matrix calculation module 41 may be omitted, and the multiplying matrices may be pre-calculated and embodied as hardware in the filter 40, or stored in a suitable non-volatile memory, such as one of the disks 28 and 32, and selected by the filter definition module in response to a user input. As a further alternative, the kernel or kernels defining the filter characteristic or characteristics may be stored, and the multiplying matrices generated from them prior to the filter 40 performing its filtering operations.

The implicit DST-based filter 40 generates the output block $Y^c$ that is an 8×8 block of filtered DCT coefficients. The output block $Y^c$ is supplied to the buffer 42, which buffers the output blocks. Alternatively, the filter can overwrite the contents of the buffer 39, in which case, the second buffer 42 is not required. For ease of illustration, however, both buffers are shown. The way in which the implicit DST-based filter 40 operates on the blocks of DCT coefficients received from the buffer 39 to generate the output block $Y^c$ of DCT coefficients corresponding to the current block $X^c$ of DCT coefficients will be described in detail below.

The buffer 42 feeds the output blocks to the encoder 44 which subjects the DCT coefficients in each output block to quantizing, run-length coding and variable-length coding using known techniques. The compressed picture signal output of the encoder 44 is then stored on the disk 32. As described above, the disks 28 and 32 need not be separate devices.

The implicit DST-based filter 40 can be constructed using dedicated hardware such as adders and multipliers. In a preferred embodiment, the filter 40 is embodied in a computer program executed by a microprocessor (not shown). In the preferred embodiment, a computer including an implicit DST-based filter program implements all of the processes described above, including fetching, decoding, filtering, encoding and storing. This disclosure provides sufficient information for a person of ordinary skill in the art to write a suitable implicit DST-based filter program using a high-level (e.g., C or C$^{++}$) or low-level programming language. Accordingly, the program listing itself is omitted. The implicit DST-based filter program could be conveyed to the computer on which it is to run by embodying the program in a suitable tangible medium of expression, such as a set of floppy disks, a CD-ROM, a DVD-ROM, or could be transmitted to such computer by a suitable data link.

Figure 5:
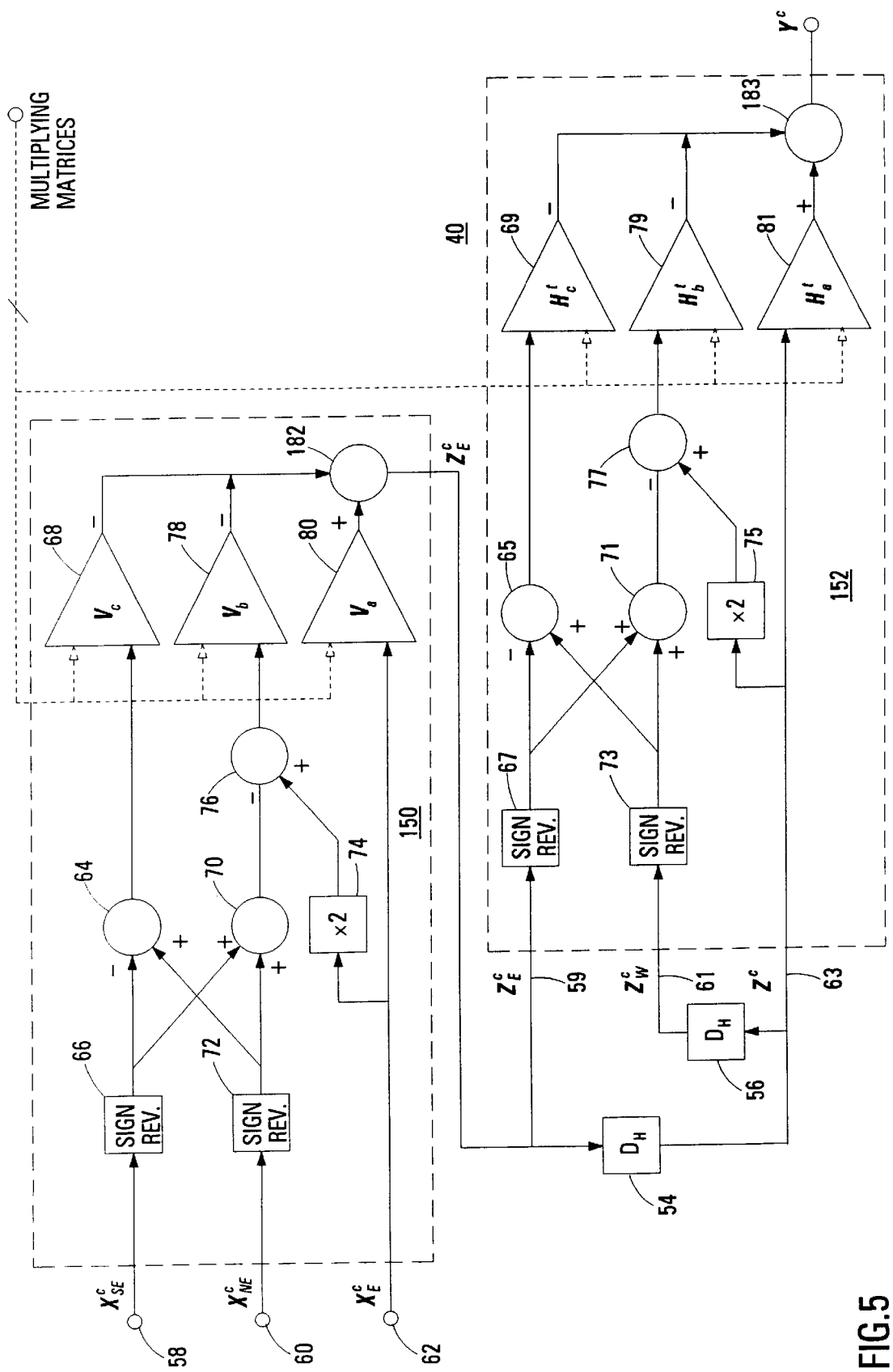
FIG. 5 is a block diagram a first embodiment of an implicit DST-based filter according to the invention in which the filter characteristics are defined by a noncausal-symmetric kernel, and the DCT coefficients are inversely quantized without altering the quantizing table.

Two different embodiments of an implicit DST-based filter that may be used as the implicit DST-based filter 40 will now be described with reference to FIGS. 5 and 6. FIG. 5 shows a first embodiment of an implicit DST-based filter in which the filter characteristics are defined by a noncausal-symmetric kernel, and the DCT coefficients are inversely quantized without altering the quantizing table. The quantizing table may be extracted from the compressed picture signal read from the disk 28 (FIG. 3) or may be a standard quantizing table. The filter is composed of the vertical processing module 150 and the horizontal processing module 152 interconnected by the serially-arranged delay circuits 54 and 56. The vertical processing module processes the blocks of DCT coefficients $X^c_{SE}$, $X^c_{NE}$ and $X^c_E$ received from the buffer 39 and generates the block of processed DCT coefficients $Z^c_E$. The blocks of processed DCT coefficients pass from the vertical processing module to the horizontal processing module through the delay circuits 54 and 56, each of which has a delay time equivalent to the time between consecutive blocks output by the vertical processing module. The delay circuits generate the blocks $Z^c$ and $Z^c_W$ from the block $Z^c_E$. The horizontal processing module, which is structurally the same as the vertical processing module, processes the blocks $Z^c_E$, $Z^c$ and $Z^c_W$ to generate the output block $Y^c$ of filtered DCT coefficients corresponding to the current block $X^c$.

The vertical processing module 150 will be described first. The vertical processing module receives the blocks $X^c_{SE}$, $X^c_{NE}$ and $X^c_E$ of DCT coefficients from the buffer 39 via the input lines 58, 60 and 62, respectively. The superscript c indicates that these blocks are blocks of DCT coefficients.

The block $X^c_{SE}$ of DCT coefficients received via the input line 58 is fed to the even-element sign reversing module 66, which generates a first intermediate block of DCT coefficients by pre-multiplying the block $X^c_{SE}$ by the diagonal matrix $\Phi$. The even elements and the odd elements of the diagonal matrix $\Phi$ have values of one and −1, respectively. The effect of the pre-multiplying operation performed by the even-element sign reversing module is to reverse the sign of all the elements in the even rows of the block $X^c_{SE}$ of DCT coefficients. In other words, the even-element sign reversing module performs an even-row sign reversing operation.

The block $X^c_{NE}$ received via the input line 60 is fed to the even-element sign reversing module 72, which generates a second intermediate block of DCT coefficients by pre-multiplying the block $X^c_{NE}$ of DCT coefficients by the diagonal matrix $\Phi$.

The first intermediate block of DCT coefficients and the second intermediate block of DCT coefficients are fed to the summing modules 64 and 70 which collectively perform a butterflying operation on the intermediate blocks of DCT coefficients. In the summing module 64, the first intermediate block is subtracted from the second intermediate block to generate a third intermediate block of DCT coefficients. In the summing module 70, the first intermediate block is added to the second intermediate block to generate a fourth intermediate block of DCT coefficients.

The third intermediate block of DCT coefficients generated by the summing module 64 is pre-multiplied by the multiplying matrix $V_c$ in the matrix multiplying module 68 to generate a first final block of DCT coefficients. The multiplying matrix $V_c$ is one of the six multiplying matrices $V_a$, $V_b$, $V_c$, $H_a$, $H_b$ and $H_c$ derived from the filter kernel by a pre-processing operation that will be described below with reference to FIG. 10. In the example shown, the pre-processing operation to derive the multiplying matrices from the filter kernel is performed by the multiplying matrix generating module 41 (FIG. 3) in response to a filter kernel supplied by the filter definition module 43. However, the multiplying matrices may be externally derived and supplied to the filter 40.

The block $X^c_E$ of DCT coefficients is received via the input line 62 and each DCT coefficient in the block is multiplied by two by the doubling module 74 to generate a fifth intermediate block of DCT coefficients. The fourth intermediate block of DCT coefficients generated by the summing module 70 is then subtracted from the fifth intermediate block of DCT coefficients generated by the doubling module 74 in the summing module 76 to generate a sixth intermediate block of DCT coefficients. The sixth intermediate block of DCT coefficients is then pre-multiplied by the multiplying matrix $V_b$ in the matrix multiplying module 78 to generate a second final block of DCT coefficients.

The block $X^c_E$ of DCT coefficients received via the input line 62 is pre-multiplied by the multiplying matrix $V_a$ in the matrix multiplying module 80 to generate a third final block of DCT coefficients.

The first, second and third final blocks of DCT coefficients generated by the matrix multiplying modules 68, 78 and 80 are fed to the summing module 182 in which the first and second final blocks of DCT coefficients generated by the matrix multiplying modules 68 and 78 are subtracted from the third final block of DCT coefficients generated by the matrix multiplying module 80 to generate the block $Z^c_E$ of DCT coefficients.

At the completion of three consecutive operations performed as just described by the vertical processing module 150, the output of the vertical processing module is a series of blocks $Z^c_W$, $Z^c$ and $Z^c_E$ of DCT coefficients, the block $Z^c_W$ being the block $Z^c_E$ generated by the first of the three consecutive operations, the block $Z^c$ being the block $Z^c_E$ generated by the second of the three consecutive operations and the block $Z^c_E$ being the block $Z^c_E$ generated by the third, most recent, of the three consecutive operations.

The series of blocks of DCT coefficients generated by the vertical processing module 150 is fed to the horizontal processing module 152 via the delay circuits 54 and 56. The delay circuits each introduce a delay equivalent to the processing time of the vertical processing module 150, i.e., the time between successive blocks of DCT coefficients output by the vertical processing module 150. Thus, the above-mentioned three consecutively-output blocks of DCT coefficients from the vertical processing module enter the horizontal processing module simultaneously after the block $Z^c_E$ is delayed by two processing times by the delay circuits 54 and 56 and the block $Z^c$ is delayed by one processing time by the delay circuit 56 since the vertical processing module generates the block $Z^c$ delayed one processing time relative to the block $Z^c_E$, and generates the block $Z^c_W$ delayed one processing time relative to the block $Z^c$. The block $Z^c$ corresponds to the current input block $X^c$.

The horizontal processing module 152 receives the blocks $Z^c_E$, $Z^c_W$ and $Z^c$ on the input lines 59, 61 and 63. The structure of the horizontal processing module is the same as that of the vertical processing module 150, and so will not be described in detail again here. Elements of the horizontal processing module corresponding to those of the vertical processing module are indicated by the same reference numeral with one added.

The processing performed by the even-element sign reversing modules 67 and 73 of the horizontal processing module 152 differs from that performed by the even-element sign reversing modules 66 and 72 of the vertical processing module 150. In the even-element sign reversing modules 67 and 73, the blocks $Z^c_E$ and $Z^c_W$ of DCT coefficients received via the input lines 59 and 61, respectively, are post-multiplied by the diagonal matrix $\Phi$. The effect of the post-multiplying operation performed by the even-element sign reversing modules 67 and 73 is to reverse the sign of all the elements in the even columns of the blocks $Z^c_E$ and $Z^c_W$. In other words, the even-element sign reversing modules 67 and 73 perform an even-column sign reversing operation.

The matrix multiplying operations performed by the matrix multiplying modules 69, 79 and 81 of the horizontal processing module 152 differs from that performed by the matrix multiplying modules 68, 78 and 80 of the vertical processing module. In the matrix multiplying modules 69, 79 and 81, the blocks of DCT coefficients are post-multiplied by the multiplying matrices $H'_c$, $H'_b$ and $H'_a$, respectively. The multiplying matrices are obtained by subjecting the above-mentioned matrices $H_c$, $H_b$ and $H_a$, respectively, to a transform that interchanges the rows and columns of the respective matrices.

The output block $Y^c$ corresponding to the current input block $X^c$ is generated by the summing module 183 in the horizontal processing module 152. The output block is a block of filtered DCT coefficients representing a block of a picture signal to which the filter characteristic of the filter 40 has been applied.

The even-element sign reversing modules 66 and 72 may alternatively follow the summing modules 64 and 70 instead of preceding them as shown in FIG. 5, and even-element sign reversing modules 67 and 73 may alternatively follow the summing modules 65 and 71 instead of preceding them.

Figure 6:
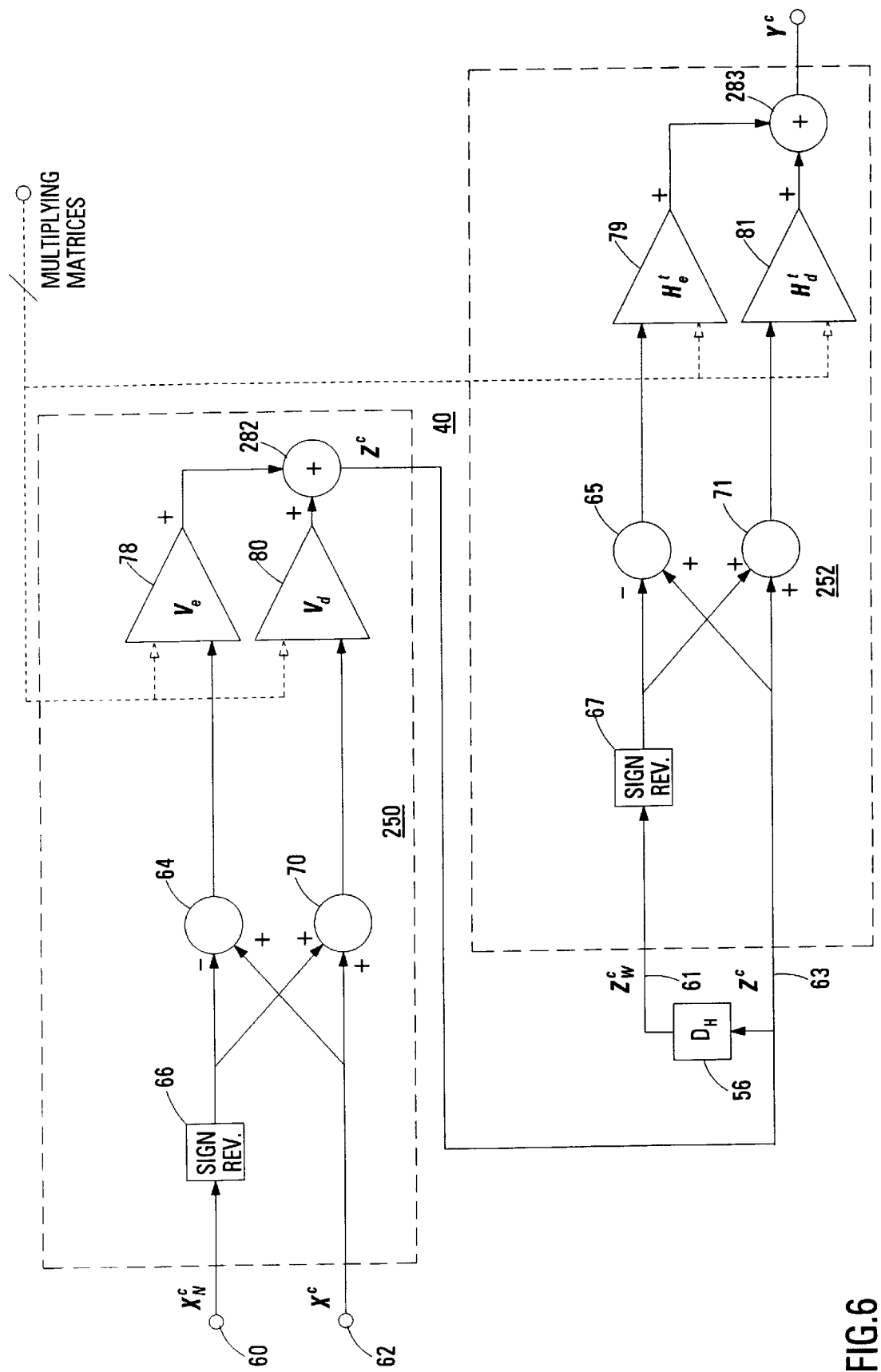
FIG. 6 is a block diagram of a second embodiment of an implicit DST-based filter according to the invention in which the filter characteristics are defined by a causal-symmetric kernel, and the DCT coefficients are inversely quantized without altering the quantizing table.

FIG. 6 shows a second embodiment of the implicit DST-based filter 40 in which the filter characteristics are defined by a causal-symmetric kernel, and the DCT coefficients are inversely quantized without altering the quantizing table. The quantizing table may be extracted from the compressed picture signal read from the disk 28 (FIG. 3) or may be a standard quantizing table. Elements of the embodiment shown in FIG. 6 that correspond to those of the embodiment shown in FIG. 5 are indicated using the same reference numerals. In this embodiment of the filter, the vertical processing module 250 and the horizontal processing module 252 are interconnected by the single delay circuit 56. The vertical processing module processes the blocks of DCT coefficients $X^c_N$ and $X^c$ received from the buffer 39 (FIG. 3) and generates the block of DCT coefficients $Z^c$. The blocks of DCT coefficients pass from the vertical processing module to the horizontal processing module through the delay circuit 56. The delay circuit has a delay time equivalent to the processing time of the vertical processing module, i.e., the time between consecutive blocks generated by the vertical processing module. The delay circuit generates the block $Z^c_W$ from the block $Z^c$. The horizontal processing module, which is structurally the same as the vertical processing module, processes the blocks $Z^c$ and $Z^c_W$ to generate the output block $Y^c$ of filtered DCT coefficients corresponding to the current block $X^c$.

The vertical processing module 250 will be described first. In this, the blocks $X^c_N$ and $X^c$ of DCT coefficients are received from the buffer 39 (FIG. 3) via the input lines 60 and 62, respectively. The block $X^c_N$ of DCT coefficients received via the input line 60 is subject to an even-element sign reversing operation in the even-element sign reversing module 66 to generate a first intermediate block of DCT coefficients. The even-element sign-reversing module pre-multiplies the block $X^c_N$ of DCT coefficients by the above-mentioned diagonal matrix Φ, which reverses the sign of all the elements in the even rows of the block $X^c_N$ of DCT coefficients. In other words, the even-element sign reversing module performs an even-row sign reversing operation on the block $X^c_N$ of DCT coefficients.

The first intermediate block of DCT coefficients generated by the even-element sign reversing module 66 and the block $X^c$ of DCT coefficients received via the input line 62 are fed to the summing modules 64 and 70. The summing modules apply a butterflying operation to these blocks. In the summing module 70, the first intermediate block of DCT coefficients is added to the block $X^c$ of DCT coefficients received via the input line 62 to generate a second intermediate block of DCT coefficients. In the summing module 64, the first intermediate block of DCT coefficients is subtracted from the block $X^c$ of DCT coefficients received via the input line 62 to generate a third intermediate block of DCT coefficients.

The second intermediate block of DCT coefficients is fed from the summing module 70 to the matrix multiplying module 80, where it is pre-multiplied by the multiplying matrix $V_d$ to generate a first final block of DCT coefficients. The third intermediate block of DCT coefficients is fed from the summing module 64 to the matrix multiplying module 78, where it is pre-multiplied by the multiplying matrix $V_e$ to generate a second final block of DCT coefficients.

Figure 11:
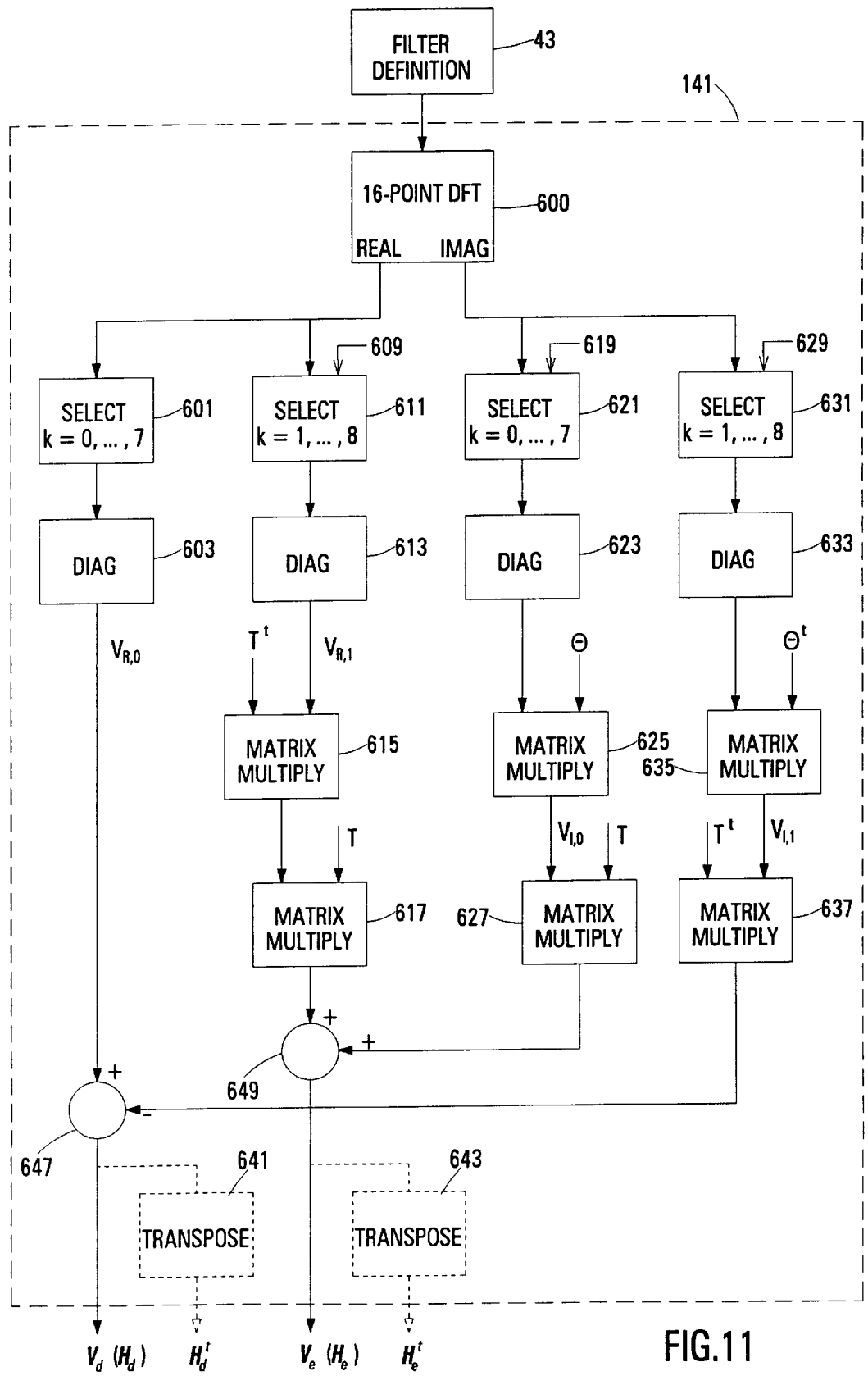
FIG. 11 is a block diagram of a second embodiment of a multiplying matrix generating module according to the invention that generates the multiplying matrices for the second embodiment of the implicit DST-based filter shown in FIG. 6.

The multiplying matrices $V_d$ and $V_e$ are two of the four multiplying matrices $V_d$, $V_e$, $H_d$ and $H_e$ derived from the causal-symmetric filter kernel by a pre-processing operation that will be described below with reference to FIG. 11.

In the arrangement just described, subjecting one of the blocks of DCT coefficients to even-row sign reversal before performing the butterflying operation enables one of the multiplying matrices to be a very sparse diagonal matrix. This reduces the number of computer operations required to implement the spatial filter shown in FIG. 6.

The first and second final blocks of DCT coefficients resulting from the matrix multiplications performed by the matrix multiplying modules 78 and 80 are summed by the summing module 282 to generate the block $Z^c$ of DCT coefficients. The output of the summing module 282 is composed of a series of blocks of DCT coefficients, each of which blocks has been generated by the operations just described.

At the completion of two consecutive operations performed as just described by the vertical processing module 150, the output of the vertical processing module is a series of blocks $Z^c_W$ and $Z^c$ of DCT coefficients, the block $Z^c_W$ being the block $Z^c$ generated by the first of the two consecutive operations and the block $Z^c$ being the block $Z^c$ generated by the second, most recent, of the two consecutive operations.

The series of blocks generated by the vertical processing module 250 is fed to the horizontal processing module 252 via the delay circuit 56. The delay circuit introduces a delay equivalent to the processing time of the vertical processing module 250, i.e., the time between successive blocks of DCT coefficients output by the vertical processing module 250. Thus, the above-mentioned two consecutively-output blocks of DCT coefficients from the vertical processing module will enter the horizontal processing module simultaneously after the block $Z^c$ is delayed by one processing time by the delay circuit 56 since the vertical processing module generates the block $Z^c_W$ delayed one processing time relative to the block $Z^c$. The block $Z^c$ corresponds to the current input block $X^c$.

The horizontal processing module 252 receives the blocks $Z^c_W$ and $Z^c$ on the input lines 61 and 63. The structure of the horizontal processing module is the same as that of the vertical processing module 250, and so will not be described in detail again here. Elements of the horizontal processing module corresponding to those of the vertical processing module are indicated by the same reference numeral with 1 added.

The processing performed by the even-element sign reversing module 67 of the horizontal processing module 252 differs from that performed by the even-element sign reversing module 66 of the vertical processing module 250. The even-element sign reversing module 67 post-multiplies the block $Z^c_W$ of DCT coefficients by the diagonal matrix Φ. The effect of the post-multiplying operation performed by the even-element sign reversing module 67 is to reverse the sign of all the elements in the even columns of the block $Z^c_W$ of DCT coefficients. In other words, the even-element sign reversing module 67 performs an even-column sign reversing operation.

The matrix multiplying operations performed by the matrix multiplying modules 79 and 81 of the horizontal processing module 252 differs from that performed by the matrix multiplying modules 78 and 80 of the vertical processing module 250. In the matrix multiplying modules 79 and 81, the intermediate blocks of DCT coefficients are post-multiplied by the multiplying matrices $H^t_e$ and $H^t_d$, respectively. The multiplying matrices $H^t_e$ and $H^t_d$ are obtained by subjecting the above-mentioned matrices $H_e$ and $H_d$, respectively, to a transform that interchanges the rows and columns of the respective matrices.

The output block $Y^c$ corresponding to the current input block $X^c$ is generated by the summing module 283 in the horizontal processing module. The output block is a block of filtered DCT coefficients representing a block of a picture signal to which the filter characteristic of the filter 40 has been applied.

Figure 7:
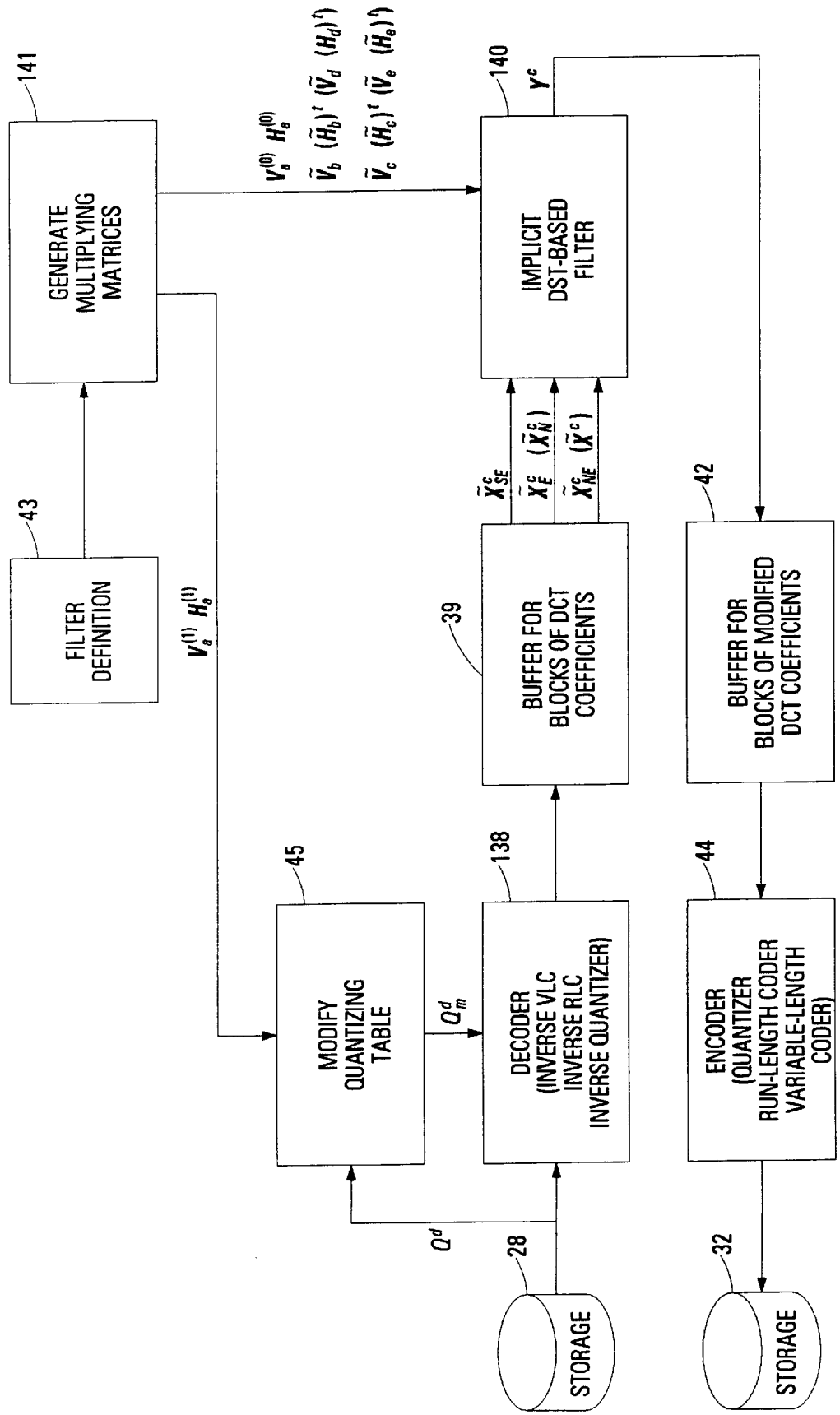
FIG. 7 is a block diagram of a second embodiment of the image/video editor of the system shown in FIG. 2 in which the third and fourth embodiments of the implicit DST-based filter according to the invention can reside.

FIG. 7 shows a block diagram of a second embodiment of an image/video editor that may be used as the image/video editor 30 shown in FIG. 2. In the second embodiment, the processing performed by the implicit DST-based filter 140 on the input blocks $X^c$ of DCT coefficients is simplified by performing additional pre-processing that alters the quantizing table used to dequantize the DCT coefficients. The quantizing table may be stored in the picture headers of the compressed picture signal read from the disk 28 or may be a standard quantizing table. The quantized DCT coefficients read from the disk 28 as part of the compressed picture signal are then inversely quantized using the modified quantizing table. In the embodiment shown in FIG. 7, elements that correspond to the embodiment shown in FIG. 3 are indicated by the same reference numeral and will not be described again here.

The compressed picture signal representing a still or moving picture is read out from the disk 28 and is fed to the decoder 138. The decoder uses known decoding techniques to reverse the variable-length coding, run-length coding and quantizing that was applied to the DCT coefficients in each block of DCT coefficients when the original picture signal was compressed to generate the compressed picture signal stored on the disk 28. The decoder 138 produces blocks of DCT coefficients and feeds these blocks into the buffer 39 in slice order.

The image/video editor shown in FIG. 7 additionally includes the quantizing table modifying module 45. The quantizing table modifying module is connected to receive the compressed picture signal read out from the disk 28, and extracts the quantizing table from the compressed picture signal. Alternatively, a standard quantizing table may be stored in the quantizing table modifying module, and the quantizing table modifying module may extract a flag bit from the compressed picture signal indicating that the stored quantizing table is to be used. In this disclosure, a reference to the quantizing table extracted from the compressed picture signal will be understood to encompass a standard quantizing table used in response to a flag bit extracted from the compressed picture signal.

In response to multiplying matrices derived by the multiplying matrix generating module 141 from the filter kernel supplied by the filter definition module 43, the quantizing table modifying module performs a pre-processing operation that modifies the quantizing table used to dequantize the DCT coefficients. The quantizing table may be extracted from the compressed picture signal or may be a standard quantizing table. The quantizing table modifying module supplies the modified quantizing table to the decoder 138 where the modified quantizing table is used to inversely quantize the DCT coefficients that also form part of the compressed picture signal.

In particular, the decoder 138 generates the block $\tilde{X}^c$ of DCT coefficients as the current block of DCT coefficients by inversely quantizing a block of quantized DCT coefficients using the modified quantizing table. The DCT coefficients in the block $\tilde{X}^c$ differs from those in the block $\tilde{X}^c$ generated by the decoder 38 in the embodiment shown in FIG. 3 in that they are inversely quantized using the modified quantizing table. The quantizing table modifying module will be described in more detail below with reference to FIG. 14.

Third and fourth embodiments of the implicit DST-based filter according to the invention will now be described with reference to FIGS. 8 and 9. These embodiments may be used as the implicit DST-based filter 140 in the image/video editor shown in FIG. 7. In both of these embodiments, the implicit DST-based filter operates on DCT coefficients that have been inversely quantized using the modified quantizing table just described. The filter characteristics are defined by a noncausal-symmetric kernel in the third embodiment of the implicit DST-based filter shown in FIG. 8, and are defined by a causal kernel in the fourth embodiment shown in FIG. 9. The third embodiment shown in FIG. 8 will be described first. Elements of the third embodiment of the filter shown in FIG. 8 that correspond to those of the first embodiment of the filter shown in FIG. 5 are indicated using the same reference numeral and will not be described again here.

In the third embodiment of the filter, the matrix multiplying module 68 pre-multiplies the intermediate blocks of DCT coefficients generated by the summing module 64 by the multiplying matrix $\tilde{V}_c$, and the matrix multiplying module 69 post-multiplies the intermediate blocks of DCT coefficients generated by the summing module 65 by the multiplying matrix $\tilde{H}^t_c$. The matrix multiplying module 78 pre-multiplies the intermediate blocks of DCT coefficients generated by the summing module 76 by the multiplying matrix $\tilde{V}_b$, and the matrix multiplying module 79 post-multiplies the intermediate blocks of DCT coefficients gen-erated by the summing module 77 by the multiplying matrix $\tilde{H}^t_b$. Finally, the matrix multiplying module 80 pre-multiplies the block $\tilde{X}^c_E$ of DCT coefficients received via the input line 62 by the multiplying matrix $V_a^{(0)}$, and the matrix multiplying module 81 multiplies the block $\tilde{Z}^c$ of DCT coefficients received via the input line 63 by the multiplying matrix $H_a^{(0)}$.

The multiplying matrices $V_a^{(0)}$, $\tilde{V}_b$, $\tilde{V}_c$, $H_a^{(0)}$, $\tilde{H}^t_b$ and $\tilde{H}^t_c$ are derived from the filter kernel by a pre-processing operation that will be described below with reference to FIG. 10 and 12. In the example shown, the pre-processing operation to derive the multiplying matrices from the filter kernel is performed by the multiplying matrix generating module 141 (FIG. 7) in response to a filter kernel supplied by the filter definition module 43. However, the multiplying matrices may be externally derived and supplied to the filter 140.

The processing performed by the third embodiment of the filter is simpler than that performed by the first embodiment of the filter because the multiplying matrices $V_a^{(0)}$ and $H_a^{(0)}$ used in the matrix multiplying modules 80 and 81, respectively, are both composed exclusively of 1s and 0s. Simple data selection operations can be used instead of normal multiplication operations when the multiplying matrix is composed exclusively of 1s and 0s.

The fourth embodiment of an implicit DST-based filter will be described next with reference to FIG. 9. This embodiment can also be used as the filter 140 in the image/video editor shown in FIG. 7. Elements of the fourth embodiment of the filter that correspond to those of the second embodiment of the filter shown in FIG. 6 are indicated by the same reference numerals and will not be described again here.

In the fourth embodiment of the filter, the matrix multiplying module 78 pre-multiplies the intermediate blocks of DCT coefficients generated by the summing module 64 by the multiplying matrix $\tilde{V}_e$, and the matrix multiplying modules 79 post-multiplies the intermediate blocks of DCT coefficients generated by the summing module 65 by the multiplying matrix $\tilde{H}^t_e$. The matrix multiplying module 80 pre-multiplies the intermediate blocks of DCT coefficients generated by the summing module 70 by the multiplying matrix $\tilde{V}_d$, and the matrix multiplying module 81 pre-multiplies the intermediate blocks of DCT coefficients generated by the summing module 71 by the multiplying matrix $\tilde{H}^t_d$. The multiplying matrices $\tilde{V}_d$, $\tilde{V}_e$, $\tilde{H}^t_d$ and $\tilde{H}^t_e$ are derived from the filter kernel by a pre-processing operation that will be described below with reference to FIGS. 11 and 13. In the example shown, the pre-processing operation to derive the multiplying matrices from the filter kernel is performed by the multiplying matrix generating module 141 (FIG. 7) in response to a filter kernel supplied by the filter definition module 43. However, the multiplying matrices may be externally-derived and supplied to the filter 140.

In the fourth embodiment of the filter, the processing performed by the filter 140 is simpler than that performed by the filter 40 of the second embodiment because no multiplications are performed by the matrix multiplying modules 78, 79, 80 and 81. This is because the multiplying matrices $\tilde{V}_d$, $\tilde{H}^t_d$, $\tilde{V}_e$ and $\tilde{H}^t_e$ are all composed of 1s and 0s only, as will be described in more detail below.

The multiplying matrix generating modules 41 and 141 shown in FIGS. 3 and 7, respectively, will now be described in detail with reference to FIGS. 10–13. The processing structure of the multiplying matrix generating module depends on whether the quantizing table used to inversely quantize the DCT coefficients is left unmodified, as in the first and second embodiments of the implicit DST-based filter described above with reference to FIGS. 5 and 6, or if the quantizing table is modified, as in the third and fourth embodiments of the filter described above with reference to FIGS. 8 and 9. The processing structure of the multiplication module also depends on whether the characteristics of the filter are defined by a noncausal-symmetric or a causal-symmetric kernel.

A first embodiment of the multiplying matrix generating module 41 will be described with reference to FIG. 10. This embodiment of the multiplying matrix generating module generates the multiplying matrices $V_a$, $V_b$, $V_c$, $H_a$, $H_b$ and $H_c$ required by the embodiment of the implicit DST-based filter 40 shown in FIG. 5. In this embodiment of the implicit DST-based filter, the filter characteristics are defined by a noncausal-symmetric filter kernel and the quantizing table remains unaltered.

The multiplying matrix generating module 41 receives the filter kernel from the filter definition module 43. The filter is defined by separable components, so that the vertical characteristics of the filter are defined independently of the horizontal characteristics. This enables the vertical and horizontal multiplying matrices to be generated independently of one another, and allows the same processing structure to be used to generate both the vertical multiplying matrices $V_a$, $V_b$, $V_c$ and the horizontal multiplying matrices $H_a$, $H_b$, $H_c$. Additional processing is then required to transpose the horizontal multiplying matrices to the form required by the horizontal matrix multipliers. Thus, the vertical multiplying matrices may be generated, and the same processing structure can then be re-used to generate the horizontal multiplying matrices. Alternatively, the generation order may be reversed. The processing structure used to generate the vertical multiplying matrices $V_a$, $V_b$, $V_c$ will be described on the understanding that the same processing structure is also used to generate the horizontal multiplying matrices $H_a$, $H_b$, $H_c$.

The filter definition module 43 feeds to the multiplying matrix generating module 41 a 16-point vector of the form: ½($v_0$/2, $v_1$, $v_2$, $v_3$, $v_4$, $v_5$, $v_6$, $v_7$, $v_8$, 0, 0, 0, 0, 0, 0, 0). This vector exactly represents the noncausal-symmetric filter kernel defining the characteristics of the filter in the vertical direction. The 16-point vector is received by the DFT module 500 which subjects it to a 16-point discrete Fourier transform. The processing performed by the DFT module generates two 16-point vectors {a(k)}, where k=0, . . . , 15. One of the vectors is composed of 16 real values corresponding to the real part of the DFT and is output from the port REAL. The other of the vectors is composed of 16 real values corresponding to the imaginary part of the DFT and is output from the port IMAG. The vector output by the port REAL is fed to the selector 501. The selector 501 forms an eight-point vector composed of points 0 through 7 of the 16-point vector received from the DFT module, and forwards the eight-point vector to the diagonalizing module 503. The diagonalizing module forms an 8×8 matrix $V_{R,0}$ whose diagonal elements are equal to the respective points of the eight-point vector received from the selector 501, and whose remaining elements are all set to zero.

The matrix $V_{R,0}$ generated by the diagonalizing module 503 is passed to the multiplying module 505 and the summing module 507. In the multiplying module 505, each element of the matrix $V_{R,0}$ is multiplied by four to generate the multiplying matrix $V_a$. The summing module will be described below.

The 16-point vector output by the port REAL of the DFT module 500 is also fed to the processing structure 509 composed of a serial arrangement of the selector 511, the diagonalizing module 513, and the two matrix multiplying modules 515 and 517. The selector 511 forms an eight-point vector composed of points 1 through 8 of the 16-point vector received from the DFT module, and forwards the eight-point vector to the diagonalizing module 513. The diagonalizing module 513 forms the 8×8 kernel matrix $V_{R,1}$ whose diagonal elements are equal to the respective points of the eight-point vector received from the selector 511 and whose remaining elements are all set to zero.

The kernel matrix $V_{R,1}$ generated by the diagonalizing module 513 is passed to the matrix multiplying module 515 which also receives the sine-cosine transform matrix $T^t$.

The transform matrix $T^t$ denotes the sine-to-cosine transform $CS^t$, where: the 8-point square DCT matrix C is defined by:

$$C=\{(c(k,n)\}_{k,n=0}^7$$

$$c(k, n) = \frac{\gamma(k)}{2}\cos\left(\frac{2n+1}{16} \cdot k\pi\right) \quad (1)$$

where $\gamma(0)=1/\sqrt{2}$ and $\gamma(k)=1$ otherwise.
The 8-point square DST matrix S is defined by:
$$S=\{(s(k,n)\}_{k,n=1}^8$$

$$s(k, n) = \frac{\sigma(k)}{2}\sin\left(\frac{2n-1}{16} \cdot k\pi\right) \quad (2)$$

where $\sigma(8)=1/\sqrt{2}$ and $\sigma(k)=1$ otherwise.
The transpose of S is $S^t$.

The multiplying matrix generating module 41 may preform preprocessing operations (not shown) to calculate the elements of the matrices C and S, from which are calculated the elements of the sine-cosine transform matrix $T^t$, and also the cosine-sine transform matrix T, to be described below. Alternatively, the elements of the matrices T and $T^t$ may be externally calculated and may be stored in a suitable memory for use by the multiplying matrix generating module, or may be embedded into the hardware of the multiplying matrix generating module.

The matrix multiplying modules 515 and 517 absorb the transform matrices into the kernel matrix $V_{R,1}$ by pre-multiplying the kernel matrix by the cosine-to sine transform and post-multiplying the kernel matrix by the sine-to-cosine transform matrix. The matrix multiplying module 515 pre-multiplies the kernel matrix $V_{R,1}$ by the sine-cosine transform matrix $T^t$. The resulting matrix passes to the matrix multiplying module 517 which also receives the cosine-to-sine transform matrix T. The cosine-sine transform matrix denotes the cosine-to-sine transform $SC^t$, where $C^t$ is the transpose of the matrix C defined above. The matrix multiplying module 517 post-multiplies the matrix received from the matrix multiplying module 515 by the cosine-sine transform matrix T and passes the resulting matrix to the summing module 507. The multiplication performed by the matrix multiplying modules is not commutative: for example, multiplying the matrix received from the matrix multiplying module 515 by the cosine-sine transform matrix T produces a different result from multiplying the cosine-sine transform matrix T by the matrix received from the matrix multiplying module 515.

The summing module 507 sums the matrices received from the diagonalizing module 503 and the matrix multiplying module 517 to generate the multiplying matrix $V_b$. Summing is performed in the sense that the matrix received from the matrix multiplying module 517 is subtracted from that received from the diagonalizing module 503.

The 16-point vector output from the port IMAG of the DFT module 501 is fed to two processing structures 519 and 529, both of which are similar to the processing structure 509. Each processing structure is composed of a serial arrangement of a selector, a diagonalizing module and two matrix multiplying modules.

The processing structure 519 differs from the processing structure 509 in that the selector 521 forms an eight-point vector composed of the points 0 through 7 of the 16-point vector received from the port IMAG of the DFT module 500. Moreover, the matrix multiplier 525 multiplies the matrix generated by the diagonalizing module 523 by the matrix Θ, defined as follows, to generate the kernel matrix $V_{I,0}$:

$$\Theta = \begin{pmatrix} 0 & 0 & 0 & 0 & 0 & 0 & 0 & 0 \\ 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \end{pmatrix}$$

Finally, the matrix multiplier 527 post-multiplies the kernel matrix $V_{I,0}$ generated by the matrix multiplier 525 by the cosine-sine transform matrix T.

The processing structure 529 differs from the processing structure 509 in that the matrix multiplier 535 post-multiplies the matrix generated by the diagonalizing module 523 by the matrix $\Theta^t$, the transpose of the matrix Θ defined above, to generate the kernel matrix $V_{I,1}$. Moreover, the matrix multiplier 537 post-multiplies the sine-cosine transform matrix $T^r$ by the kernel matrix $V_{I,1}$.

The matrices generated by the processing structures 519 and 529 pass to the summing module 539 which sums them to generate the multiplying matrix $V_c$. The summing is performed in the sense that the matrix generated by one of the processing structures is added to that generated by the other.

The above-described processing structure is then re-used to generate the multiplying matrices $H_a$, $H_b$ and $H_c$ from a 16-point vector of the form: ½($h_0/2$, $h_1$, $h_2$, $h_3$, $h_4$, $h_5$, $h_6$, $h_7$, $h_8$, 0, 0, 0, 0, 0, 0, 0). This vector characteristics of the filter in the horizontal direction. Since the matrix multiplying modules 81, 79 and 69 of the implicit DST-based filter 40 shown in FIG. 5 respectively require the transposed multiplying matrices $H^t_a$, $H^t_b$ and $H^t_c$, the multiplying matrices $H_a$, H, and H, respectively generated by the multiplying module 505, the summing module 507 and the summing module 539 of the processing structure just described are passed to the transposing modules 541, 543 and 545 where the rows and columns of the matrices are transposed. Since the transposing modules are only used to generate the multiplying matrices $H^t_a$, $H^t_b$ and $H^t_c$ and are not used to generate the multiplying matrices $V_a$, $V_b$ and $V_c$, they are indicated by broken lines in the drawing.

The six multiplying matrices $V_a$, $V_b$, $V_c$, $H^t_a$, $H^t_b$ and $H^t_c$ are then passed to the respective one of the matrix multiplying modules 80, 78, 68, 81, 79 and 69 of the implicit DST-based filter 40 shown in FIG. 5. Alternatively, if the multiplying matrices are externally generated, they may be stored for transfer or may otherwise be transmitted to the implicit DST-based filter.

A second embodiment of multiplying matrix generating module 41 will next be described with reference to FIG. 11. This embodiment generates the multiplying matrices $V_d$, $V_e$, $H^t_d$, and $H^t_e$ for the embodiment of the implicit DST-based filter 40 shown in FIG. 6. In this embodiment of the implicit DST-based filter, the filter characteristics are defined by a causal-symmetric filter kernel, and the quantizing table remains unaltered. Elements of the processing structure shown in FIG. 11 that are similar to those of the processing structure shown in FIG. 10 are indicated by the same reference numerals with 100 added.

The multiplying matrix generating module receives the filter kernel from the filter definition module 43. The filter characteristics are defined by separable components, so that the vertical characteristics of the filter are defined independently of the horizontal characteristics. The processing structure used to generate the vertical multiplying matrices $V_d$ and $V_e$ will be described on the understanding that the same processing structure is used to generate the horizontal multiplying matrices $H_d$ and $H_e$. Additional processing is then required to transpose the horizontal multiplying matrices to the form required by the horizontal matrix multipliers.

The filter kernel received from the filter definition module is a 16-point vector of the form ½($v_0$, $v_1$, $v_2$, $v_3$, $v_4$, $v_5$, $v_6$, $v_7$, $v_8$, 0, 0, 0, 0, 0, 0, 0).

The kernel matrix $V_{R,0}$ generated by the diagonalizing matrix 603 is fed to the summing module 647 where it is summed with the matrix generated by the processing structure 629 to generate the multiplying matrix $V_d$. The summing module sums the matrices in the sense that the matrix generated by the processing structure 629 is subtracted from the matrix $V_{R,0}$ generated by the diagonalizing matrix 603.

Figure 10:
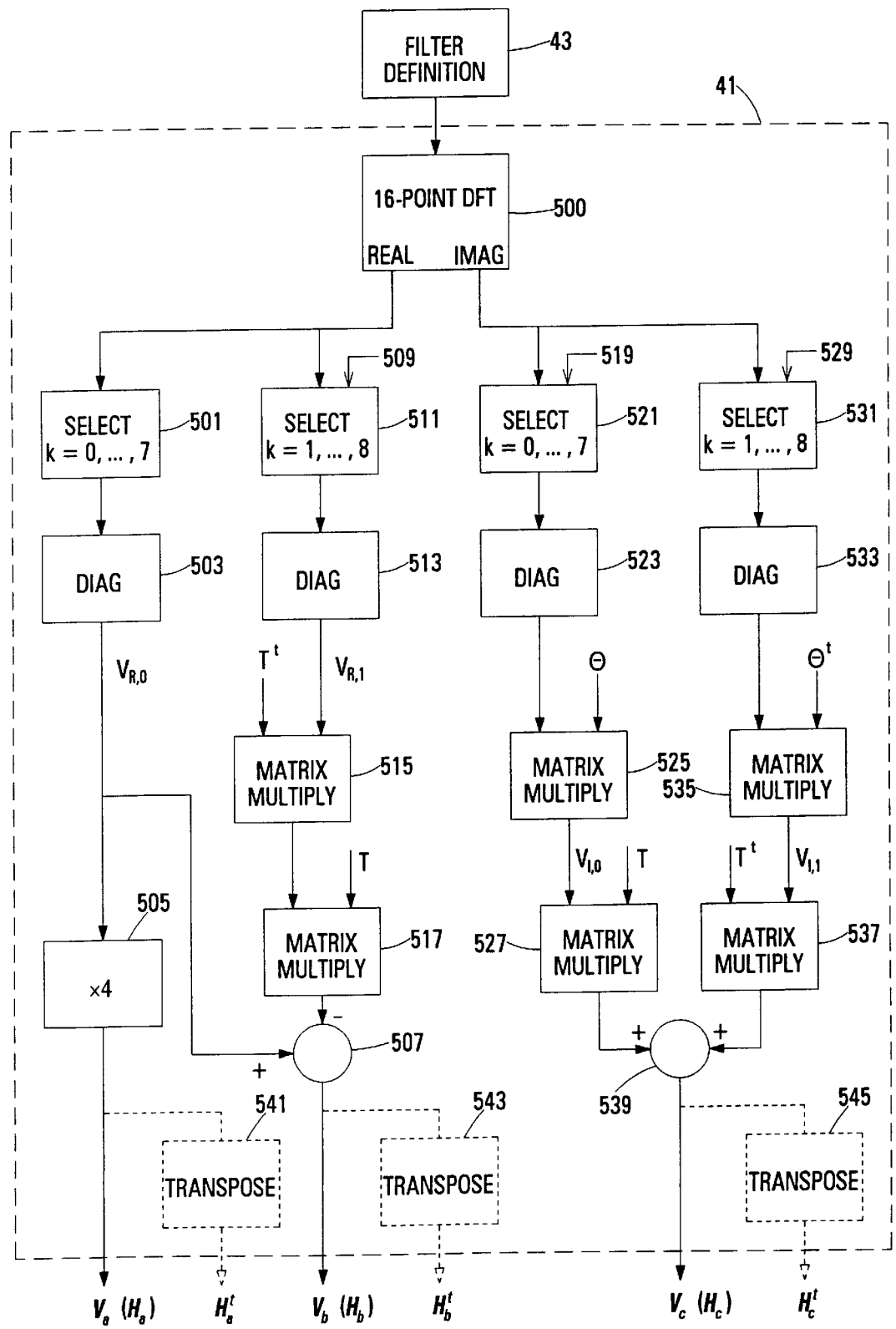
FIG. 10 is a block diagram of a first embodiment of a multiplying matrix generating module according to the invention that generates from the filter kernel the multiplying matrices for the first embodiment of the implicit DST-based filter shown in FIG. 5.

The processing structures 609, 619 and 629 are identical to the processing structures 509, 519 and 529, respectively, of the embodiment shown in FIG. 10, and so will not be described in detail.

The matrices generated by the processing structures 609 and 619 are fed to the summing module 643 which sums them to generate the multiplying matrix $V_e$. The summing module sums the matrices in the sense that the matrices are added.

The above-described processing structure is then re-used to generate the horizontal multiplying matrices $H_d$ and $H_e$ from a 16-point vector of the form: ½($h_0$, $h_1$, $h_2$, $h_3$, $h_4$, $h_5$, $h_6$, $h_7$, $h_8$, 0, 0, 0, 0, 0, 0, 0). This vector defines the characteristics of the filter in the horizontal direction. Since the matrix multiplying modules 79 and 81 in the horizontal processing module respectively require the transposed multiplying matrices $H^t_d$ and $H^t_e$, the multiplying matrices $H_d$ and $H_e$ respectively generated by the summing modules 647 and 649 of the processing structure just described are passed to the transposing modules 641 and 643 where the rows and columns of the matrices are transposed. Since the transposing modules are only used to generate the multiplying matrices $H^t_d$ and $H^t_e$ and are not used to generate the multiplying matrices $V_d$ and $V_e$, they are indicated by broken lines in the drawing.

Figure 12:
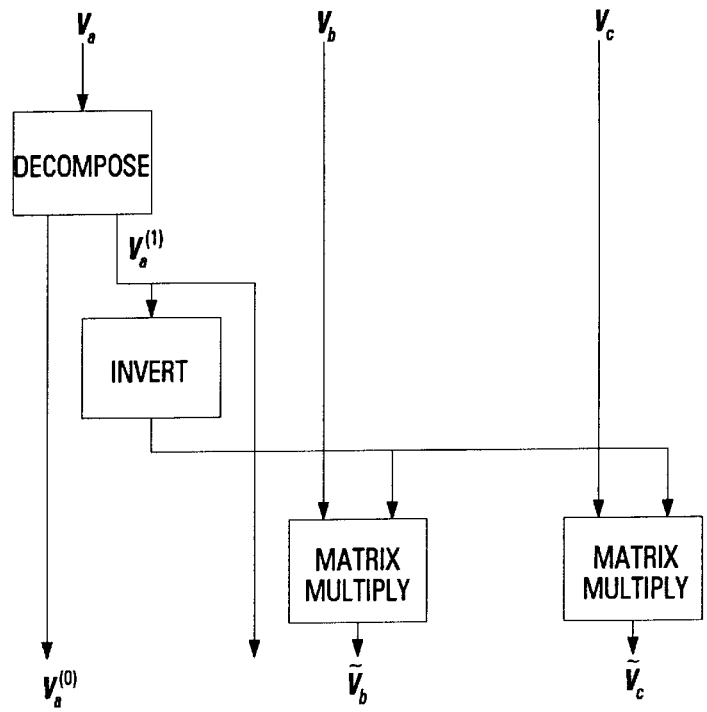
FIG. 12 is a block diagram of the additional pre-processing structure that generates the multiplying matrices for the embodiment of the implicit DST-based filter shown in FIG. 8, and additionally generates the multiplying matrices for the quantizing table modifying module shown in FIG. 7 when the filter characteristics are defined by a noncausal-symmetric kernel.
Figure 13:
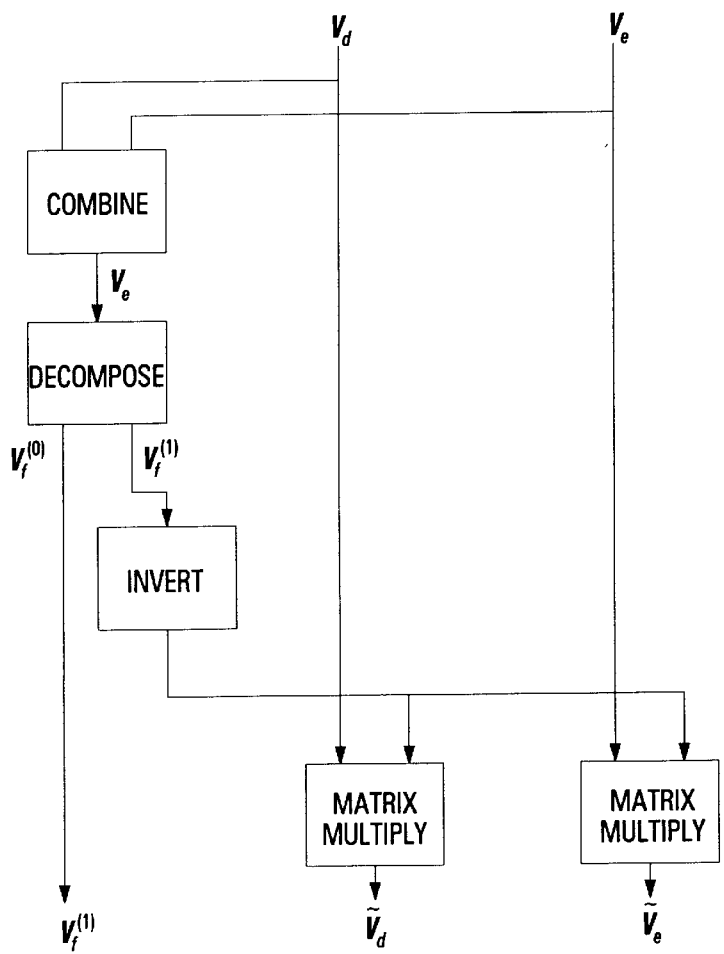
FIG. 13 is a block diagram of the additional pre-processing structure that generates the multiplying matrices for the embodiment of the implicit DST-based filter shown in FIG. 9, and additionally generates the multiplying matrices for the quantizing table modifying module shown in FIG. 7 when the filter characteristics are defined by a causal-symmetric kernel.

The additional pre-processing structures required when the quantizing table is modified are shown in FIGS. 12 and 13. The pre-processing structure shown in FIG. 12 generates the multiplying matrices required by the embodiment of the implicit DST-based filter shown in FIG. 8, and additionally generates the multiplying matrices required by the quantizing table modifying module 45 shown in FIG. 7 when the filter characteristics are defined by a noncausal-symmetric kernel. The pre-processing structure receives the multiplying matrices $V_a$, $V_b$, $V_c$, $H_a$, $H_b$ and $H_c$ generated by the multiplying matrix generating module 41 shown in FIG. 10 and generates from them the multiplying matrices $V_a^{(0)}$, $\tilde{V}_b$ and $\tilde{V}_c$ required by the vertical processing module 350 shown in FIG. 8, the multiplying matrices $H_a^{(0)}$, $H_b^t$ and $H_c^t$ required by the horizontal processing module 352, and the multiplying matrices $V_a^{(1)}$ and $H_a^{(1)}$ required by the quantizing table modifying module. Thus, multiplying matrix generating module 41 shown in FIG. 10 and the pre-processing structure shown in FIG. 12 collectively constitute a first embodiment of the multiplying matrix generating module 141 shown in FIG. 7.

Figure 9:
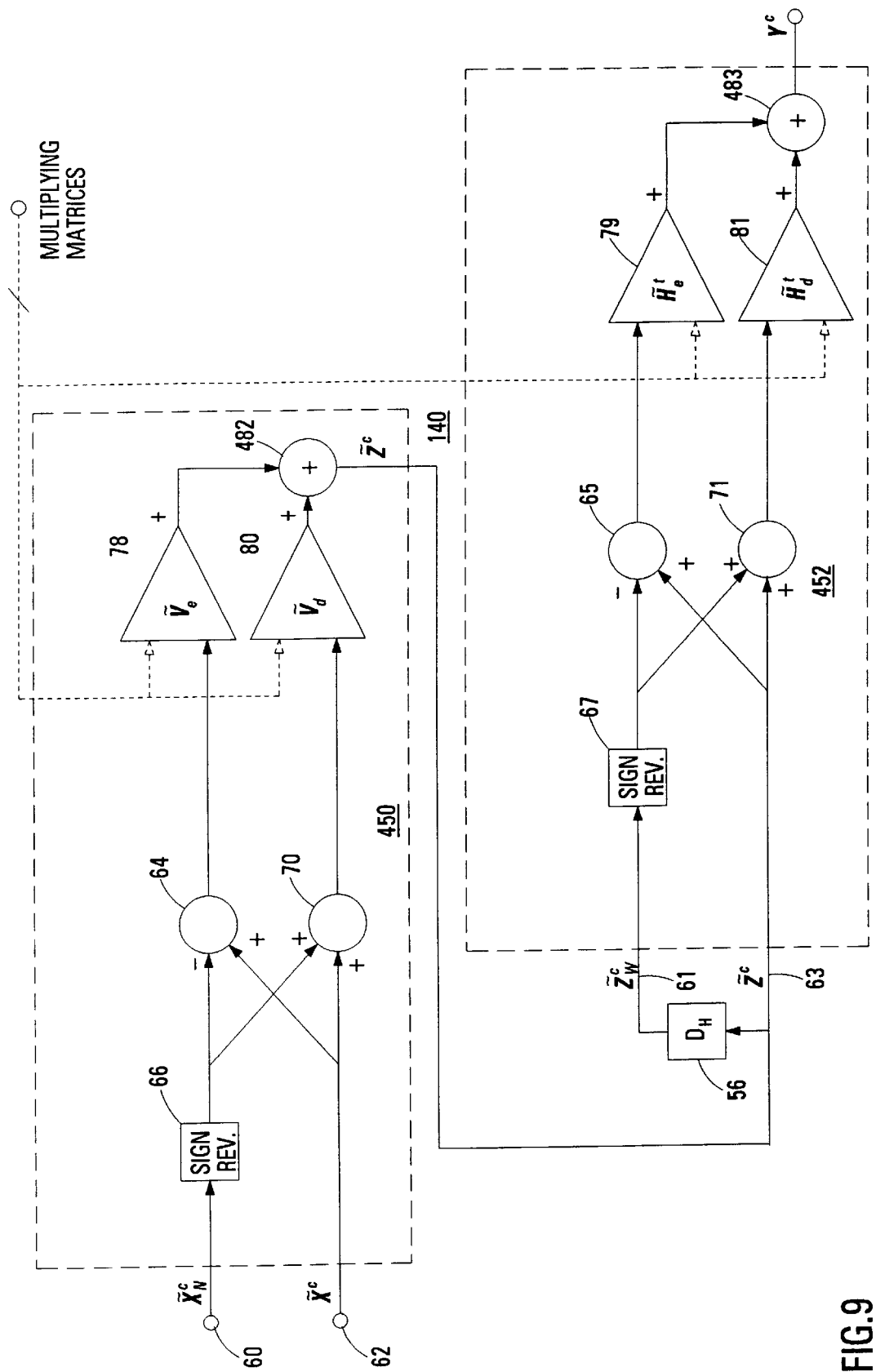
FIG. 9 is a block diagram of a fourth embodiment of an implicit DST-based filter according to the invention in which the filter characteristics are defined by a causal-symmetric kernel, and the DCT coefficients are inversely quantized using a modified quantizing table.

The pre-processing structure shown in FIG. 13 generates the multiplying matrices required by the embodiment of the implicit DST-based filter shown in FIG. 9, and additionally generates the multiplying matrices required by the quantizing table modifying module 45 shown in FIG. 7 when the filter characteristics are defined by a noncausal-symmetric kernel. The pre-processing structure receives the multiplying matrices $V_d$, $V_e$, $H_d$ and $H_e$ generated by the multiplying matrix generating module 41 shown in FIG. 11 and generates from them the multiplying matrices $\tilde{V}_d$ nd $\tilde{V}_e$ required by the vertical processing module 450 shown in FIG. 9, the multiplying matrices $\tilde{H}_d^t$ and $\tilde{H}_e^t$ required by the horizontal processing module 452, and the multiplying matrices $V_f^{(1)}$ and $H_f^{(1)}$ required by the quantizing table modifying module. Thus, multiplying matrix generating module 41 shown in FIG. 11 and the pre-processing structure shown in FIG. 13 collectively constitute a second embodiment of the multiplying matrix generating module 141 shown in FIG. 7.

The embodiment shown in FIG. 12 will be described first. Operation of the processing structure to generate the vertical multiplying matrices $V_a^{(0)}$, $V_a^{(1)}$, $\tilde{V}_b$ and $\tilde{V}_c$ will be described on the understanding that the same processing structure is also used to generate the horizontal multiplying matrices $H_a^{(0)}$, $H_a^{(1)}$, $\tilde{H}_b$ and $\tilde{H}_c$. To generate the multiplying matrices $V_a^{(0)}$, $V_a^{(1)}$, $\tilde{V}_b$ and $\tilde{V}_c$, the processing described above with reference to FIG. 10 is first performed to generate the multiplying matrices $V_a$, $V_b$, $V_c$. These multiplying matrices are then forwarded to the pre-processing structure shown in FIG. 12. In the pre-processing structure, the multiplying matrix $V_a$ is received by the decomposing module 551 that generates the two multiplying matrices $V_a^{(0)}$ and $V_a^{(1)}$ by decomposing the multiplying matrix $V_a$. The multiplying matrices $V_a$, $V_a^{(0)}$ and $V_a^{(1)}$ are all diagonal matrices. The multiplying matrix $V_a^{(1)}$ is identical to the multiplying matrix $V_a$ except for the elements on the diagonal that are equal to zero. The values of such elements are changed from zero to one. The multiplying matrix $V_a^{(0)}$ is identical to an 8×8 identity matrix except for the elements on the diagonal corresponding to the elements on the diagonal of the multiplying matrix $V_a$ whose value is equal to zero. The values of such elements in the multiplying matrix $V_a^{(0)}$ are set to zero. The multiplying matrix $V_a^{(0)}$ is output for use by the vertical processing module 350 (FIG. 8) and the multiplying matrix $V_a^{(1)}$ is output for use by the quantizing table modifying module 45 (FIGS. 7 and 14).

The multiplying matrix $V_a^{(1)}$ is also passed to the inverting module 553 where its elements are inverted. The resulting inverted matrix is fed to the matrix multiplying modules 555 and 557. The matrix multiplying modules additionally receive the multiplying matrices $V_b$ and $V_c$ from the processing structure shown in FIG. 10. The matrix multiplying module 555 multiplies the multiplying matrix $V_b$ by the inverted matrix generated by the inverting module 553 to generate the multiplying matrix $\tilde{V}_b$. The matrix multiplying module 557 multiplies the multiplying matrix $V_c$ by the inverted matrix generated by the inverting module 553 to generate the multiplying matrix $\tilde{V}_c$.

The above-described processing structure is then re-used to generate the multiplying matrices $H_a^{(0)}$, $H_a^{(1)}$, $\tilde{H}_b$ and $\tilde{H}_c$.

Since the matrix multiplying modules 79 and 69 of the horizontal processing module 352 respectively require the transposed multiplying matrices $\tilde{H}_b^t$ and $\tilde{H}_c^t$, the multiplying matrices $\tilde{H}_b$ and $\tilde{H}_c$ respectively generated by the matrix multiplying modules 555 and 557 of the processing structure just described are passed to the transposing modules 559 and 561 where the rows and columns of the matrices are transposed. Since the transposing modules 555 and 557 are only used to generate the multiplying matrices $\tilde{H}_b^t$ and $\tilde{H}_c^t$, and are not used to generate the multiplying matrices $\tilde{V}_b$ and $\tilde{V}_c$, they are indicated by broken lines in the drawing.

Figure 8:
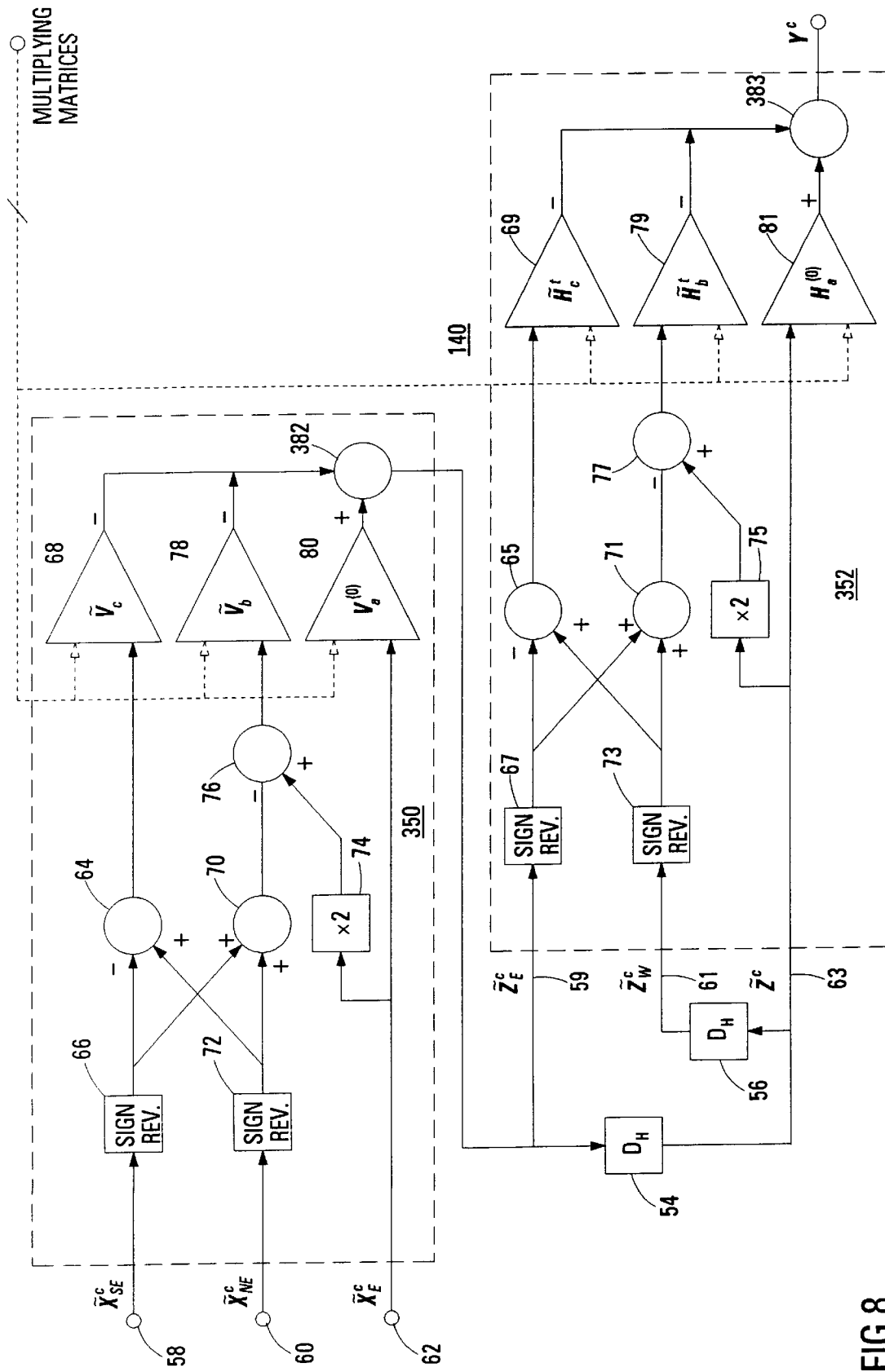
FIG. 8 is a block diagram a third embodiment of an implicit DST-based filter according to the invention in which the filter characteristics are defined by a noncausal-symmetric kernel, and the DCT coefficients are inversely quantized using a modified quantizing table.

The multiplying matrices $V_a^{(0)}$, $\tilde{V}_b$ and $\tilde{V}_c$ are then passed to the matrix multiplying modules 80, 78 and 68, respectively, in the vertical processing module 350 shown in FIG. 8, and the multiplying matrices $H_a^{(0)}$, $\tilde{H}_b$ and $\tilde{H}_c$ are passed to the matrix multiplying modules 81, 79 and 69 in the horizontal processing module 352. Alternatively, if the multiplying matrices are externally generated, they may be stored for transfer or otherwise transmitted to the implicit DST-based filter 40. In addition, the multiplying matrices $V_a^{(1)}$ and $H_a^{(1)}$ are passed to the quantizing table modifying module 45 shown in FIG. 7. The quantizing table modifying module will be described in detail below with reference to FIG. 14.

The embodiment shown in FIG. 13 will now be described. This embodiment generates the multiplying matrices for a filter defined by a causal symmetric filter kernel and in which the quantizing table is changed. Since the processing structure of the embodiment shown in FIG. 13 is similar to that of the embodiment shown in FIG. 12, corresponding elements are indicated by the same reference numerals with 100 added.

To generate the multiplying matrices, the processing described above with reference to FIG. 11 is first performed to generate the multiplying matrices $V_d$, $V_e$, $H_d$ and $H_e$. These multiplying matrices are then forwarded to the processing structure shown in FIG. 13. In the processing structure, the multiplying matrices $V_d$ and $V_e$ are received by the combining module 663. The combining module combines the multiplying matrices to generate the diagonal multiplying matrix $V_f$. The combining module combines the multiplying matrices $V_d$ and $V_e$ to generate the multiplying matrix $V_f$ so that the even diagonal elements of the matrix $V_f$ are equal to the even diagonal elements of the matrix $V_d$ and the odd diagonal elements of the matrix $V_f$ are equal to the odd diagonal elements of the matrix $V_e$.

The multiplying matrix $V_f$ is then passed to a processing structure composed of the decomposing module 651, the inverting module 653 and the two matrix multiplying modules 655 and 657 that is the same as the processing structure shown in FIG. 12. Thus, the matrix multiplying modules 655 and 657 respectively multiply the multiplying matrices $V_d$ and $V_e$ by an inversion of the multiplying matrix $V_f^{(1)}$ to generate the multiplying matrices $\tilde{V}_d$ and $\tilde{V}_e$. This is similar to the way in which the multiplying matrices 555 and 557 multiply the multiplying matrices $V_b$ and $V_c$ by an inversion of the multiplying matrix $V_a^{(1)}$ to generate the multiplying matrices $\tilde{V}_b$ and $\tilde{V}_c$.

The decomposing module 651 may be simplified compared with the decomposing module 551 shown in FIG. 12 because the multiplying matrix $V_f^{(0)}$ is not used, and therefore need not be generated.

The processing structure just described is used to generate the horizontal multiplying matrices $H_f^{(0)}$, $H_f^{(1)}$, $\tilde{H}_d$ and $\tilde{H}_e$. The transposing modules 659 and 661 then transpose the multiplying matrices $\tilde{H}_d$ and $\tilde{H}_e$ to generate the multiplying matrices $\tilde{H}_d^t$ and $\tilde{H}_E^t$.

The multiplying matrices $\tilde{V}_d$ and $\tilde{V}_e$ are then passed to the matrix multiplying modules 80 and 78, respectively, in the vertical processing module 450 shown in FIG. 9, and the multiplying matrices $\tilde{H}^t_d$ and $\tilde{H}^t_e$ are passed to the matrix multiplying modules 81 and 79, respectively, in the horizontal processing module 452. Alternatively, if the multiplying matrices are externally generated, they may be stored for transfer or otherwise transmitted to the implicit DST-based filter 140. In addition, the multiplying matrices $V_f^{(1)}$ and $H_f^{(1)}$ are passed to the quantizing table modifying module 45 shown in FIG. 7.

The quantizing table modifying module 45 will now be described with reference to FIG. 14. The quantizing table modifying module is composed of the matrix multiplier 565 and the matrix multiplier 567. The matrix multiplying module 567 is connected to receive the matrix generated by the matrix multiplier 565.

When the characteristics of the implicit DST-based filter are defined by a noncausal-symmetric kernel, the matrix multiplying module 565 receives the multiplying matrix $V_a^{(1)}$ from the decomposing module 551 of the processing structure shown in FIG. 12. When the filter characteristics are defined by a causal symmetric kernel, the matrix multiplying module receives the multiplying matrix $V_f^{(1)}$ from the decomposing module 651 of the processing structure shown in FIG. 13. The matrix multiplying module 565 also receives the quantizing table $Q_d$ and multiplies the multiplying matrix by the quantizing table. The quantizing table may be extracted from the picture signal read from the disk 28, or may be a standard quantizing table. The matrix generated by the matrix multiplying module 565 is fed to the matrix multiplying module 567.

When the filter characteristics are defined by a noncausal-symmetric kernel, the matrix multiplying module 567 receives the multiplying matrix $H_a^{(1)}$ from the decomposing module 551 of the processing structure shown in FIG. 12. When the filter characteristics are defined by a causal-symmetric kernel, the matrix multiplying module receives the multiplying matrix $H_f^{(1)}$ from the decomposing module 651 of the processing structure shown in FIG. 13. The matrix multiplying module also receives the matrix generated by the matrix multiplying module 565, and multiplies this matrix by the multiplying matrix by $H_a^{(1)}$ or $H_f^{(1)}$. The resulting modified quantizing table $Q_m^d$ is fed to the decoder module 138 (FIG. 7) where it is used to dequantize the DCT coefficients in the picture signal read from the disk 28 and decoded by the inverse variable-length coder and inverse run-length coder that form part of the decoder module 138.

In a preferred embodiment, the implicit DST-based filter 140 that operates in the embodiment of the image/video filter shown in FIG. 7 in which the quantizing table used to decode the quantized DCT coefficients is modified is implemented in a computer using a PA-RISC reduced instruction set microprocessor made by the Hewlett-Packard Company. The computational complexity required to implement the filter 140 using such a computer will now be described in terms of the number of additions and the number of additions required. On average, each multiplication performed using the PA-RISC processor is equivalent to performing three additions.

Two alternatives will be considered. In the first alternative, at least one of the nine input blocks $\tilde{X}^c_i$, $i \in$ {SE, S, SW, E, 0, W, NE, N, NW} that are subject to the filtering operation performed by the implicit DST-based filter 140 to generate the output block $Y^c$ is not "sparse." In the second alternative, all of the nine input blocks are sparse. As noted above, the implicit DST-based filter 140 is particularly efficient when the blocks of DCT coefficients are sparse, as is the case with the majority of the blocks constituting a typical picture signal. A block of DCT coefficients is defined in this disclosure as being "sparse" if its non-zero coefficients are confined to its upper-left 4×4 quadrant. This corresponds to the spectrum of the spatial information represented by the block of DCT coefficients consisting of low-frequency components only. When a block of DCT coefficients is sparse, it satisfies the following equation:

$$X_c = U X_c U$$

where $\underline{\Delta}$ a diag. {1,1,1,1,0,0,0,0}.

If all the blocks $\tilde{X}^c_i$, $i \in$ {SE, S, SW, E, 0, W, NE, N, NW} subject to processing by the implicit DST-based filter to generate the block $Y^c$ are sparse, substituting for $\tilde{X}^c$ in equations (26), (27), (30) and (31) set forth below causes the multiplying matrices $V_a^{(0)}$, $\tilde{V}_b$, $\tilde{V}_c$, $\tilde{V}_d$ and $\tilde{V}_e$ to be premultiplied by U and the multiplying matrices $H_a^{(0)}$, $\tilde{H}_b$, $\tilde{H}_c$, $\tilde{H}_d$ and $\tilde{H}_e$ to be post-multiplied by U. The effect of this is that the latter four columns of the V matrices and the latter four rows of the H matrices are all filled with zeros. This reduces the number of multiplication operations involved in each matrix multiplication operation since the matrix multiplication operation involves multiplication by only the first four rows and the first four columns of the multiplying matrices when all the blocks are sparse. Information on whether the current input block and the neighboring blocks of DCT coefficients are sparse is included as run-length information in the compressed picture signal and can therefore be obtained from the decoder module 138.

The computational complexity of the embodiment shown in FIG. 8, in which the filter characteristics are defined by a non-causal symmetric kernel, is shown in Table 1.

TABLE 1

| Operation | Performed by (FIG. 8) | Non-sparse | | Sparse | |
|---|---|---|---|---|---|
| | | mult | add | mult | add |
| Store previous values of $\tilde{Z}^c$ and $\tilde{Z}^c_E$ in $\tilde{Z}^c_W$ and $\tilde{Z}^c$, respectively | 54, 56 | 0 | 0 | 0 | 0 |
| Store $V_a^{(0)} \tilde{X}^c_E$ in $\tilde{Z}^c_E$ | 80, 382 | 0 | 0 | 0 | 0 |
| Store $\tilde{Z}^c_E - \tilde{V}_b [2\tilde{X}^c_E \cdot \Phi$ $(\tilde{X}^c_{NE} + \tilde{X}^c_{SE})]$ in $\tilde{Z}^c_E$ | 70, 72, 74, 76, 78, 382 | 256 | 384 | 64 | 96 |
| Store $\tilde{Z}^c_E \cdot \tilde{V}_c \Phi$ $(\tilde{X}^c_{NE} + \tilde{X}^c_{SE})$ in $\tilde{Z}^c_E$ | 64, 66, 68, 382 | 256 | 320 | 64 | 80 |
| Store $\tilde{Z}^c H_a^{(0)}$ in $Y^c$ | 81, 383 | 0 | 0 | 0 | 0 |
| Store $Y^c - [2\tilde{Z}^c - (\tilde{Z}_W + \tilde{Z}^c_E) \Phi] (\tilde{H}_b)^t$ in $Y^c$ | 71, 73, 75, 77, 79, 383 | 256 | 384 | 128 | 192 |
| Store $Y^c - (\tilde{Z}^c_W - \tilde{Z}^c_E) \Phi (\tilde{H}_c)^t$ in $Y^c$ | 65, 67, 69, 383 | 256 | 320 | 128 | 160 |

Thus, the total number of operations required to generate the output block $Y^c$ from the nine input blocks of DCT coefficients when the input blocks are not sparse is 1,024 multiplications and 1,408 additions, corresponding to 4,480 basic PA-RISC operations. When the input blocks are sparse, the total number of operations is 384 multiplications and 528 additions, corresponding to 1680 basic PA-RISC operations.

For comparison, the above-mentioned spatial filter described in U.S. patent application Ser. No. 08/612,513 requires 1152 multiplications and 1536 additions (4992

PA-RISC operations) to generate a similar output block when the input blocks are non-sparse and 432 multiplications and 528 additions (1824 PA-RISC operations) when the input blocks are sparse. Thus, the implicit DST-based filter according to the invention is computationally more efficient than the above-mentioned filter with both sparse and non-sparse input blocks.

The computational complexity of the embodiment shown in FIG. 9, in which the filter characteristics are defined by a causal symmetric kernel, is shown in Table 2.

TABLE 2

| Operation | Performed by: (FIG. 9) | Non-sparse mult | Non-sparse add | Sparse mult | Sparse add |
|---|---|---|---|---|---|
| Store previous value of $\tilde{Z}^c$ in $\tilde{Z}^c_W$ | 56 | 0 | 0 | 0 | 0 |
| Store odd rows of $\hat{V}_d$ ($\hat{X}^c + \Phi \hat{X}^c_N$) in odds rows of $\tilde{Z}^c$ | 66, 70, 80, 482 | 128 | 160 | 32 | 40 |
| Store even rows of $\hat{V}_e(\hat{X}^c - \Phi \hat{X}^c_N)$ in even rows of $\tilde{Z}^c$ | 64, 66, 78, 482 | 224 | 256 | 56 | 64 |
| Store odd columns of $(\tilde{Z}^c + \tilde{Z}^c_W \Phi)(\hat{H}_d)^t$ in odd columns of $Y^c$ | 67, 71, 81, 483 | 128 | 160 | 64 | 80 |
| Store odd columns of $(\tilde{Z}^c - \tilde{Z}^c_W \Phi)(\hat{H}_e)^t$ in odd columns of $Y^c$ | 65, 67, 79, 483 | 224 | 256 | 112 | 128 |

Thus, the total number of operations required to generate the output block $Y^c$ from the nine input blocks of DCT coefficients when the input blocks are not sparse is 704 multiplications and 832 additions, corresponding to 2,944 basic PA-RISC operations. When the input blocks are sparse, the total number of operations is 264 multiplications and 312 additions, corresponding to 1,104 basic PA-RISC operations.

The above-mentioned spatial filter described in U.S. patent application Ser. No. 08/612,513 does not accept a causal-symmetric kernel. However, if a kernel of up to nine taps in each dimension is assumed, the implicit DST-based filter with the causal-symmetric kernel can be properly compared with the above-mentioned filter with a noncausal-symmetric kernel. Such comparison indicates that the implicit DST-based filter according to the invention requires 41% fewer operations with non-sparse input blocks and 39% fewer operations with sparse input blocks.

It can be seen that the implicit DST-based filter according to the invention is considerably more efficient when the filter characteristics are defined by a causal-symmetric filter than when the filter characteristics are defined by a noncausal-symmetric kernel. However, causal-symmetric kernels are rarely encountered in picture processing applications. Nevertheless, the efficiency advantages of the causal-symmetric kernel can be obtained by applying a 4-pixel shift, in each dimension, to the spatial coefficients of a noncausal-symmetric kernel. This requires that the filter kernel be no longer than nine taps in each dimension. Converting a noncausal-symmetric kernel to a causal-symmetric kernel results in a 4-pixel shift in the filtered picture relative to the original picture. However, such a shift is acceptable in many applications, especially those involving human visualization. Alternatively, the shift can be compensated for in subsequent processing.

In the above description, is has been assumed that the picture signal subject to filtering by the implicit DST-based filter according to the invention is already in the compressed state. However, this is not critical. The picture signal subject to filtering may be a conventional spatial-domain signal. In this case, the implicit DST-based filter according to the invention is preceded by a suitable compression module and is followed by a complementary expansion module. Suitable compression modules and expansion modules are known in the art and will not be described here.

The mathematical operations on which the above-described processing performed by the implicit DST-based filters 40 and 140 is based will now be described.

The 8-point square DCT matrix C and the 8-point square DST matrix S are defined by equations (1) and (2) set forth above.

The different types of transforms of the 8×8, two-dimensional block:

$$x = \underline{\underline{\Delta}} \{ (x(n,m) \}_{n,m-1}^{8}$$

can be obtained by pre-multiplying and post-multiplying the block x by the above DCT and DST matrices as follows:

$$X^c \underline{\underline{\Delta}} CxC^t \quad (3)$$

$$X^{sc} \underline{\underline{\Delta}} SxC^t \quad (4)$$

$$X^{cs} \underline{\underline{\Delta}} CxS^t \quad (5)$$

$$X^s \underline{\underline{\Delta}} SxS^t \quad (6)$$

Equations (3) and (6) correspond to the 2-dimensional DCT and the 2-dimensional DST, respectively. The transforms represented by equations (4) and (5) are mixed DST/DCT and DCT/DST transforms, respectively.

A picture signal that has been compressed according to the JPEG or MPEG standard includes 2-dimensional blocks of DCT coefficients. In other words, the picture signal includes a sequence of 8×8 matrices $X_1^c, X_2^c, \ldots$ of DCT coefficients corresponding to the 8×8 blocks $x_1, x_2, \ldots$ in the spatial domain that constitute the original, non-compressed picture signal I(i,j). The implicit DST-based filter according to the invention generates a sequence of 8×8 matrices $Y_1^c, Y_2^c, \ldots$ of DCT coefficients corresponding to the 8×8 blocks $y_1, y_2, \ldots$ in the spatial domain that constitute the filtered version J(i,j) of the original, non-compressed picture signal I(i,j) according to:

$$J(i, j) \stackrel{\Delta}{=} \sum_{i'} \sum_{j'} f(i', j') I(i - i', j - j')$$

in which f(i,j) is the impulse response of the filter.

The implicit DST-based filter according to the invention performs the above filtering operation on the compressed picture signal $X_1^c, X_2^c, \ldots$ without requiring that the compressed picture signal be expanded back to the spatial domain, that convolution be performed in the spatial domain, and that the filtered picture signal be re-compressed.

The implicit DST-based filter according to the invention operates with a filter size that is always smaller than 17×17 so that every block $Y^c$ of DCT coefficients, corresponding to the block y in the spatial domain, constituting the filtered picture signal $\{J(i,j)\}$ depends only on the corresponding block $X^c$ of DCT coefficients, corresponding to the block x of the original, uncompressed picture signal, and the eight neighboring blocks of DCT coefficients immediately surrounding the block $X^c$. These blocks of DCT coefficients are labelled according to their compass-wise direction relative to the current block $X^c$. For example, the block of the previous slice in the same position as the current block in the current slice is to the north of the current block, so is labelled with the subscript "N," i.e., $X^c_N$. The labelling convention for the neighboring blocks of DCT coefficients is shown in FIG. 4. A similar convention is used to label the blocks x in the spatial domain. Thus, the block in the spatial domain corresponding to the block $X^c_N$ of DCT coefficients is labelled $x_N$. The implicit DST-based filter according to the invention filters the compressed picture signal by successively generating a block $Y^c$ of DCT coefficients by processing the DCT coefficients in the current block $X^c$ and the neighboring blocks $X^c_N$, $X^c_{NE}$, $X^c_E$, $X^c_{SE}$, $X^c_S$, $X^c_{SW}$, $X^c_W$ and $X^c_{NW}$. When the filter characteristics are defined by a causal-symmetric filter kernel, the block $Y^c$ is generated by processing the current block and only those neighboring blocks that precede the current block in the current picture, i.e., the neighboring blocks $X^c_N$, $X^c_W$ and $X^c_{NW}$ to the north and west of the current block The implicit DST-based filter according to the invention operates with a filter definition that is separable, i.e., $f(i,j)=v_i h_j$ for some one-dimensional sequences $\{v_i\}$ and $\{h_j\}$. This enables the filtering operation performed by the filter to be expressed in the following block matrix form:

$$y = V \cdot \begin{pmatrix} x_{NW} & x_N & x_{NE} \\ x_W & x & x_E \\ x_{SW} & x_S & x_{SE} \end{pmatrix} \cdot H^t \quad (7)$$

where H and V are 8×24 matrices of the form:

$$V = \begin{pmatrix} v_8 & v_7 & \ldots & v_1 & v_0 & v_{-1} & \ldots & v_{-7} & v_{-8} & 0 & \ldots & 0 \\ 0 & v_8 & v_7 & \ldots & v_1 & v_0 & v_{-1} & \ldots & v_{-7} & v_{-8} & 0 & \ldots & 0 \\ \vdots & & & & & & & & & & & & \\ 0 & \ldots & 0 & v_8 & v_7 & \ldots & v_1 & v_0 & v_{-1} & \ldots & v_{-7} & v_{-8} \end{pmatrix} \quad (8)$$

$$H = \begin{pmatrix} h_8 & h_7 & \ldots & h_1 & h_0 & h_{-1} & \ldots & h_{-7} & h_{-8} & 0 & \ldots & 0 \\ 0 & h_8 & h_7 & \ldots & h_1 & h_0 & h_{-1} & \ldots & h_{-7} & h_{-8} & 0 & \ldots & 0 \\ \vdots & & & & & & & & & & & & \\ 0 & \ldots & 0 & h_8 & h_7 & \ldots & h_1 & h_0 & h_{-1} & \ldots & h_{-7} & h_{-8} \end{pmatrix} \quad (9)$$

For noncausal-symmetric kernels, $v_{-n}=v_n$ and $h_{-n}=h_n$, $n=1, \ldots, 8$. The cosine-to-sine transform (CST) may be denoted by $T \triangleq SC^t$ and the sine-to-cosine transform (SCT) may be denoted by $T^t=CS^t$. The vectors $\Theta$ and $\Phi$ are defined as follows:

$$\Theta = \begin{pmatrix} 0 & 0 & 0 & 0 & 0 & 0 & 0 & 0 \\ 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \end{pmatrix}, \quad (10)$$

$$\Phi = \begin{pmatrix} 1 & 0 & 0 & 0 & 0 & 0 & 0 & 0 \\ 0 & -1 & 0 & 0 & 0 & 0 & 0 & 0 \\ 0 & 0 & 1 & 0 & 0 & 0 & 0 & 0 \\ 0 & 0 & 0 & -1 & 0 & 0 & 0 & 0 \\ 0 & 0 & 0 & 0 & 1 & 0 & 0 & 0 \\ 0 & 0 & 0 & 0 & 0 & -1 & 0 & 0 \\ 0 & 0 & 0 & 0 & 0 & 0 & 1 & 0 \\ 0 & 0 & 0 & 0 & 0 & 0 & 0 & -1 \end{pmatrix}$$

The kernel matrices V and H may be decomposed into triangular matrices $V_1^+$, $V_2^+$, $V_1^-$, $V_2^-$, $H_1^+$, $H_2^+$, $H_1^-$, $H_2^-$ such that $V=\{V_1^+, V_2^++V_2^-, V_1^-\}$ and $H=\{H_1^+, H_2^++H_2^-, H_1^-\}$. Butterflied combinations of the above triangular matrices are then diagonalized by the DCT and DST operators to generate the diagonal kernel matrices $V_{R,0}$, $V_{R,1}$, $V_{I,0}$, $V_{I,1}$, defined as follows:

$$V_{R,0} \triangleq \frac{1}{2} \cdot diag\{V_R(0), \ldots, V_R(7)\} \quad (11)$$

$$V_{R,1} \triangleq \frac{1}{2} \cdot diag\{V_R(1), \ldots, V_R(8)\} \quad (12)$$

$$V_{I,0} \triangleq \frac{1}{2} \cdot diag\{V_I(0), \ldots, V_I(7)\} \cdot \Theta \quad (13)$$

$$V_{I,1} \triangleq \frac{1}{2} \cdot diag\{V_I(1), \ldots, V_I(8)\} \cdot \Theta^t \quad (14)$$

where $V_R(k)$ and $V_I(k)$, $k=0, \ldots, 15$ are the real and imaginary parts, respectively, of the discrete Fourier transform (DFT) of the vector:

$$\{\alpha \cdot v_0, v_1, v_2, v_3, v_4, v_5, v_6, v_7, v_8, 0, 0, 0, 0, 0, 0, 0\}. \quad (15)$$

In the noncausal-symmetric case, $\alpha=0.5$. The diagonalized H kernels are similarly defined.

The block $Y^c$ can then be calculated using:

$Y^c=[2Z^c+(Z^c_W+Z^c_E)\Phi]H_{R,0}-[(Z^{cs}_W-Z^{cs}_E)\Phi](H_{I,0})^t+\{[2Z^{cs}-(Z^{cs}_W+$ $$Z^{cs}{}_E)\Phi]H_{R,1} - (Z^c{}_W - Z^c{}_E)\Phi(H_{I,1})^t\}T \tag{16}$$

where:

$$Z^c{}_E = V_{(R,0)}[2X^c{}_E + \Phi(X^c{}_{NE} + X^c{}_{SE})] - V_{(I,0)}\Phi(X^{sc}{}_{NE} - X^{sc}{}_{SE}) + T^t\{V_{(R,1)}[2X^{sc}{}_E - \Phi(X^{sc}{}_{NE} + X^{sc}{}_{SE})] - V_{(I,1)}\Phi(X^c{}_{NE} - X^c{}_{SE})\} \tag{17}$$

and $Z^c$ and $Z^c{}_W$ are calculated by sequentially substituting $(X^c{}_N, X^c, X^c{}_S, X^{sc}{}_N, X^{sc}$ and $X^{sc}{}_S)$ and $(X^{cs}{}_{NW}, X^{cs}{}_W, X^{cs}{}_{SW}, X^c{}_{NW}, X^c{}_W$ and $X^c{}_{SW})$ for $(X^c{}_{NE}, X^c{}_E, X^c{}_{SE}, X^{sc}{}_{NE}, X^{sc}{}_E$ and $X^{cs}{}_{SE})$, respectively, in equation (17). The mixed DST/DCT blocks $X_i^{sc}$, i $\in$ {SE, S, SW, E, 0, W, NE, N, NW}, are obtained by pre-multiplying the respective blocks $X_i^c$ of DCT coefficients by the cosine-to-sine transform T. Similarly, the mixed DCT/DST blocks $Z_j^{cs}$ j $\in$ {E, 0, W} are obtained by post-multiplying the respective blocks of DCT coefficients by the sine-to cosine transform $T^t$. Note that the blocks $Z^c$ and $Z^c{}_W$ of DCT coefficients do not have to be generated because they are respectively identical to the blocks $Z^c{}_E$ generated for the first and second blocks immediately the current block.

When the filter characteristics are defined by a causal or causal-symmetric kernel defined by $h_n = v_n = 0$ for n<0, $\alpha = 1$ in equation (15) and the block $Y^c$ is calculated from the relationship:

$$Y^c = (Z^c + Z^c{}_W\Phi)H_{R,0} + (Z^{cs} - Z^{cs}{}_W\Phi)(H_{I,0})^t + [(Z^{cs} - Z^{cs}{}_W\Phi)H_{R,1} - (Z^c + Z^c{}_W\Phi)(H_{I,1})^t]T \tag{18}$$

where:

$$Z^c = V_{R,0}(X^c + \Phi X^c{}_N) + V_{I,0}(X^{sc} - \Phi X^{scN}) + T^t[V_{R,1}(X^{sc} - \Phi X^{scN}) - V_{I,1}(X^c + \Phi X^c{}_N)] \tag{19}$$

and $Z^c{}_W$ is generated by substituting $(X^c{}_{NW}, X^c{}_W, X^c{}_{SW}, X^{sc}{}_{NW}, X^c{}_{SW}$ and $X^{cs}{}_{SW})$ for $(X^c{}_N, X^c, X^c{}_S, X^{sc}{}_N, X^{sc}$ and $X^{cs}{}_S)$, respectively, in equation (19).

In the implicit DST-based filter according to the invention, the DCT/DST and DST/DCT transforms are not calculated explicitly. Instead, two alternative approaches are used. In the first alternative, the cosine-to-sine transform matrix CST and the sine-to-cosine transform matrix SCT are absorbed into the kernel matrices so that only the blocks of DCT coefficients need be operated upon. This loses the advantage of the kernel matrices being diagonal matrices, but this loss is not serious in the usual case in which the blocks of DCT coefficients are sparse. Embodiments of the filter using this approach are shown in FIGS. 5 and 6 above.

In the second alternative, the cosine-to-sine transform matrix CST and the sine-to-cosine transform matrix SCT are absorbed into the kernel matrices and the quantizing table used to dequantize the quantized DCT coefficients generated according to the JPEG or MPEG standard is additionally modified to reduce the number of multiplications required. Embodiments of the filter using this approach are shown in FIGS. 8 and 9.

The mathematical basis of the embodiment shown in FIG. 5 will be described first. In this embodiment, the CST and SCT matrices are absorbed into the kernel matrices and the kernel is noncausal-symmetric.

The mixed DCT/DST and DST/DCT transforms can be written in terms of DCT coefficients as follows:

$$X_i^{sc} = TX_i^c, \forall_i \in \{SE, S, SW, E, 0, W, NE, N, NW\},$$

$$Z_i^{cs} = Z_i^c T^t, \forall_i \in \{E, 0, W\}$$

From the above, the associativity of matrix multiplication and the relation $T\Phi = \Phi T$, the CST and SCT matrices, T and $T^t$, can be absorbed into the kernel matrices by manipulating equations (16) and (17) as follows:

The invention provides an implicit DST-based filter having characteristics defined by a linear convolution kernel. The filter filters an information signal composed of blocks of discrete cosine transform (DCT) coefficients to generate a filtered information signal also composed of blocks of DCT coefficients. The filter comprises multiplying matrices, a deriving module, matrix multiplying modules and a summing module. The multiplying matrices are obtained by absorbing a cosine-to-sine transform and a sine-to-cosine transform into kernel matrices derived from the linear convolution kernel. The deriving module derives intermediate blocks of DCT coefficients from neighboring ones of the blocks of DCT coefficients constituting the information signal. The matrix multiplying modules multiply the intermediate blocks of DCT coefficients by the multiplying matrices. The summing module sums the blocks of DCT coefficients generated by the matrix multiplying modules to generate the blocks of DCT coefficients constituting the filtered information signal.

The filter may additionally comprise additional multiplying matrices derived from the kernel matrices, additional matrix multiplying modules in which the quantizing table used to quantize the DCT coefficients is pre- and post-multiplied by the additional multiplying matrices to generate a modified quantizing table, and an inverse quantizer that uses the modified quantizing table to inversely quantize the DCT coefficients in the blocks of DCT coefficients constituting the information signal to generate the blocks of DCT coefficients from which the deriving module derives the intermediate blocks of DCT coefficients.

At least one of the multiplying matrices may be composed exclusively of elements having values of one and zero.

The kernel matrices from which the multiplying matrices are obtained may be derived from a discrete Fourier transform of a vector that exactly represents the linear convolution kernel.

The deriving module may include a module that applies an even-element sign reversal operation to ones of the neighboring ones of the blocks of DCT coefficients constituting the information signal to generate even-element sign-reversed blocks, and a module that performs either a butterflying operation between the even-element sign-reversed blocks, or a butterflying operation between ones of the even-element sign-reversed blocks and ones of the neighboring ones of the blocks of DCT coefficients constituting the information signal.

In a two-dimensional filter, the multiplying matrices may include first multiplying matrices derived from a vertical component of the linear convolution kernel, and second multiplying matrices derived from a horizontal component of the linear convolution kernel. The deriving module may include a first additional deriving module that derives first additional intermediate blocks of DCT coefficients from vertically-neighboring ones of the blocks of DCT coefficients constituting the information signal. The matrix multiplying modules may include first matrix multiplying modules in which the first additional intermediate blocks of DCT coefficients are pre-multiplied by the first multiplying matrices to generate final blocks of DCT coefficients. The deriving module may additionally include an additional summing module in which the final blocks of DCT coefficients generated by the first matrix multiplying modules are summed to generate second additional intermediate blocks of DCT coefficients, and a second additional deriving module that derives the intermediate blocks of DCT coefficients from horizontally-neighboring ones of the second additional intermediate blocks of DCT coefficients. The matrix multiplying modules may include second matrix multiplying modules in which the intermediate blocks of DCT coefficients are post-multiplied by the second multiplying matrices.

The implicit DST-based filter may additionally comprise a multiplying matrix generator that generates the multiplying matrices from the linear convolution kernel. The multiplying matrix generator includes a kernel matrix deriving module and first, second and third matrix multiplying modules. The kernel matrix deriving module derives a first kernel matrix, a second kernel matrix, a third kernel matrix and a fourth kernel matrix from the linear convolution kernel. In the first matrix multiplying module, the first kernel matrix is pre-multiplied by a sine-to-cosine transform matrix and the result is post-multiplied by a cosine-to-sine transform matrix to generate a first further intermediate matrix. In the second matrix multiplying module, the second kernel matrix is post-multiplied by the cosine-to-sine transform matrix to generate a second further intermediate matrix. In the third matrix multiplying module, the third kernel matrix is pre-multiplied by the sine-to-cosine transform matrix to generate a third further intermediate matrix.

When the linear convolution filter is noncausal-symmetric, the multiplying matrix generator additionally includes a multiplying module and first and second summing modules. The multiplying module multiplies the fourth kernel matrix by an integer to generate a first one of the multiplying matrices. The first summing module subtracts the first further intermediate matrix from the fourth kernel matrix to generate a second one of the multiplying matrices. The second summing module adds the second further intermediate matrix to the third further intermediate matrix to generate a third one of the multiplying matrices.

When the linear convolution kernel is causal, the multiplying matrix generator additionally includes first and second summing modules. The first summing module subtracts the third further intermediate matrix from the fourth kernel matrix to generate a first one of the multiplying matrices. The second summing module adds the first further intermediate matrix and the second further intermediate matrix to generate a second one of the multiplying matrices.

$$Y^c = Z^c (H_a)^t - [2Z^c - (Z^c_W + Z^c_E)\Phi](H_b)^t - (Z^c_W - Z^c_E)\Phi(H_c)^t \quad (20)$$

and $$Z^c_E = V_a X^c_E - V_b [2X^c_E - \Phi(X^c_{NE} - X^c_{SE})] - V_c \Phi(X^c_{NE} - X^c_{SE}) \quad (21)$$

where:

$V_a = 4V_{R,0}$, $H_a = 4H_{R,0}$
$V_b = V_{R,0} - T^t V_{R,1} T$, $H_b = H_{R,0} - T^t H_{R,1} T$
$V_c = V_{I,0} T + T^t V_{I,1}$, $H_c = H_{I,0} T + T^t H_{I,1}$

The multiplying matrices $V_a$, $V_b$, $V_c$, $H_a$, $H_b$ and $H_c$ are new DCT-domain kernel matrices that operate exclusively on the DCT coefficients. Since the multiplying matrices operate exclusively on the DCT coefficients, the implicit DST-based filter according to the invention does not require that DST coefficients be generated from the DCT coefficients.

The original kernel matrices are diagonal matrices, and the matrix T has a checkerboard structure in which half of the elements are zero. Consequently, the multiplying matrices $V_b$, $V_c$, $H_b$ and $H_c$ have a maximum of 32 non-zero elements each. The multiplying matrices $V_a$ and $H_a$ are both diagonal matrices.

The mathematical basis of the embodiment shown in FIG. 6 will be described next. In this embodiment, the cosine-to-sine transform matrix CST and the sine-to-cosine transform matrix SCT are absorbed into the kernel matrices and the kernel is causal-symmetric. Manipulation of equations (18) and (19) in a manner similar to that just described results in:

$$Y^c = (Z^c + Z^c_W \Phi)(H_d)^t + (Z^c - Z^c_W \Phi)(H_e)^t \quad (22)$$

and $$Z^c = V_d (X^c + X^c_N) + V_e (X^c - \Phi X^c_N) \quad (23)$$

where:

$V_d = V_{R,0} - T^t V_{I,1}$, $H_d = H_{R,0} - T^t H_{I,1} T$
$V_e = T^t V_{R,1} T + V_{I,0} T$, $H_e = T^t H_{R,1} T + H_{I,0} T$

The multiplying matrices $V_d$, $V_e$, $H_d$ and $H_e$ are new DCT-domain kernel matrices that operate exclusively on the DCT coefficients. In other words, the implicit DST-based filter according to the invention does not require that DST coefficients be generated from the DCT coefficients. The multiplying matrices $V_d$ and $H_d$ each have a maximum of 20 non-zero elements that are concentrated in the odd rows. The multiplying matrices $V_e$ and $H_e$ each have a maximum of 32 non-zero elements that are concentrated in the even rows.

The mathematical basis of the embodiment shown in FIG. 8 will be described next. In this embodiment, the quantizing table is modified and the kernel is noncausal-symmetric. The multiplying matrix $V_a$ may be decomposed into two factors, one of which is invertible, i.e., $V_a = V_a^{(1)} V_a^{(0)}$, where $V_a^{(1)}$ and $V_a^{(0)}$ are both diagonal matrices with diagonal elements given by:

$$(V_a^{(1)})_{ii} \triangleq \begin{cases} (V_a)_{ii}, & (V_a)_{ii} \neq 0 \\ 1, & \text{otherwise} \end{cases} \quad (V_a^{(0)})_{ii} \triangleq \begin{cases} 1, & (V_a)_{ii} \neq 0 \\ 0, & \text{otherwise} \end{cases} \quad (24)$$

The multiplying matrix $H_a$ may be similarly decomposed. The quantizing table $Q^d$ is then replaced by a modified quantizing table $Q_m^d$ obtained by pre-multiplying $Q^d$ by $V_a^{(1)}$ and post-multiplying the result by $H_a^{(1)}$, i.e., $V_a^{(1)} Q^d H_a^{(1)}$. The result of inversely quantizing the DCT coefficients using the modified quantizing table is:

$$\tilde{X}^c_j \triangleq V_a^{(1)} X^c_j H_a^{(1)}, \forall j \in \{SE, S, SW, E, 0, W, NE, N, NW\} \quad (25)$$

The filtered block $Y^c$ of DCT coefficients is obtained by manipulating equations (20) and (21) as follows:

$$Y^c = \tilde{Z}^c H^{(0)}_a - [2\tilde{Z}^c - (\tilde{Z}^c_W + \tilde{Z}^c_E)\Phi](\tilde{H}_b)^t - (\tilde{Z}^c_W - \tilde{Z}^c_E)\Phi(\tilde{H}_c)^t \quad (26)$$

$$\tilde{Z}^c_E \triangleq Z_E^c H^{(1)}_a = V^{(0)}_a \tilde{X}^c_E - \tilde{V}_b [2\tilde{X}^c_E - \Phi(\tilde{X}^c_{NE} + \tilde{X}^c_{SE})] - \tilde{V}_c \Phi(\tilde{X}^c_{NE} - \tilde{X}^c_{SE}) \quad (27)$$

where:

$\tilde{V}_b = V_b (V^{(1)}_a)^{-1}$, $\tilde{H}_b = H_b (H^{(1)}_a)^{-1}$
$\tilde{V}_c = V_c (V^{(1)}_a)^{-1}$, $\tilde{H}_c = H_c (H^{(1)}_a)^{-1}$ The multiplying matrices $\tilde{V}_b$, $\tilde{V}_c$, $\tilde{H}_b$ and $\tilde{H}_c$ have a maximum of 32 non-zero elements. The matrix multiplication modules 80 and 81 need perform no actual multiplication operations to multiply by the multiplying matrices $V_a^{(0)}$ and $H_a^{(0)}$, respectively, since the elements of these multiplying matrices are ones or zeros only.

Finally, the mathematical basis of the embodiment shown in FIG. 9 will be described. In this embodiment, the quantizing table is modified and the kernel is causal-symmetric.

The matrix $V_f$ is defined as a diagonal matrix whose odd diagonal elements are identical to the odd diagonal elements of the multiplying matrix $V_d$, and whose even diagonal elements are identical to the even diagonal elements of the multiplying matrix $V_e$. In other words, for i=1, ..., 8:

$$(V_f)_{ii} \triangleq \begin{cases} (V_d)_{ii}, & \text{If } i \text{ is odd} \\ (V_e)_{ii}, & \text{If } i \text{ is even} \end{cases} \qquad (28)$$

The matrix $H_f$ is similarly defined.

The matrices $V_f$ and $H_f$ are then decomposed into the matrices $V_f^{(0)}$, $V_f^{(1)}$, $H_f^{(0)}$ and $H_f^{(1)}$, respectively, in the same way as the matrices $V_a$ and $H_a$. The quantizing table $Q^d$ is then replaced by a modified quantizing table $Q_m^d$ obtained by pre-multiplying $Q^d$ by $V_f^{(1)}$ and post-multiplying the result by $H_f^{(1)}$, i.e., $Q_m^d = V_f^{(1)} Q^d H_f^{(1)}$.

The result of inversely quantizing the DCT coefficients using the modified quantizing table is:

$$\tilde{X}^c \triangleq V_f^{(1)}, \forall_f \in \{SE, S, SW, E, 0, W, NE, N, NW\} \qquad (29)$$

The filtered block $Y^c$ is obtained by manipulating equations (20) and (21) as follows:

$$Y^c = (\tilde{Z}^c + \tilde{Z}^c_W \Phi)(\tilde{H}_d)^t + (\tilde{Z}^c - \tilde{Z}^c_W \Phi)(\tilde{H}_e)^t \qquad (30)$$

$$\tilde{Z}^c \triangleq Z^c H^{(1)}_f = \tilde{V}_d(\tilde{X}^c + \Phi \tilde{X}^c_N) + \tilde{V}_e(\tilde{X}^c - \Phi \tilde{X}^c_N) \qquad (31)$$

where:

$$\tilde{V}_d = V_d(V^{(1)}_f)^{-1} \quad \tilde{H}_d = H_d(H^{(1)}_f)^{-1}$$
$$\tilde{V}_e = V_e(V^{(1)}_f)^{-1} \quad \tilde{H}_e = H_e(H^{(1)}_f)^{-1}$$

The multiplying matrices $\tilde{V}_d$, $\tilde{V}_e$, $\tilde{H}_d$ and $\tilde{H}_e$ all have their diagonals filled with zeros and ones.

Although this disclosure describes illustrative embodiments of the invention in detail, it is to be understood that the invention is not limited to the precise embodiments described, and that various modifications may be practiced within the scope of the invention defined by the appended claims.

We claim:

1. An implicit DST-based filter for filtering an information signal composed of blocks of discrete cosine transform (DCT) coefficients to generate a filtered information signal composed of blocks of DCT coefficients, the filter having characteristics defined by a linear convolution kernel and comprising:

deriving means for deriving intermediate blocks of DCT coefficients from neighboring ones of the blocks of DCT coefficients constituting the information signal;

matrix multiplying modules in which the intermediate blocks of DCT coefficients are multiplied by multiplying matrices obtained by absorbing a cosine-to-sine transform and a sine-to-cosine transform into kernel matrices derived from the linear convolution kernel, the multiplying matrices including elements; and a summing module in which blocks of DCT coefficients generated by the matrix multiplication modules are summed to generate the blocks of DCT coefficients constituting the filtered information signal.

2. The implicit DST-based filter of claim 1, in which at least one of the multiplying matrices is composed exclusively of elements having values of one and zero.

3. The implicit DST-based filter of claim 1, additionally comprising a multiplying matrix generating module that generates the multiplying matrices from kernel matrices derived from a discrete Fourier transform of a vector that exactly represents the linear convolution kernel.

4. The implicit DST-based filter of claim 1, in which the DCT coefficients in the blocks of DCT coefficients constituting the information signal have been quantized using a quantizing table, and the filter additionally comprises:

additional matrix multiplying modules in which the quantizing table is pre- and post-multiplied by additional multiplying matrices derived from the kernel matrices to generate a modified quantizing table; and an inverse quantizer that inversely quantizes the DCT coefficients in the blocks of DCT coefficients constituting the information signal using the modified quantizing table to generate the blocks of DCT coefficients from which the deriving means derives the intermediate blocks of DCT coefficients.

5. The implicit DST-based filter of claim 1, in which:
   the deriving means includes:
     means for applying an even-element sign reversal operation to ones of the neighboring ones of the blocks of DCT coefficients constituting the information signal to generate even-element sign-reversed blocks; and
     means for performing one of (a) a butterflying operation between the even-element sign-reversed blocks, and (b) a butterflying operation between ones of the even-element sign-reversed blocks and the ones of the neighboring ones of the blocks of DCT coefficients constituting the information signal.

6. The implicit DST-based filter of claim 1, in which:
   the linear convolution kernel includes a vertical component and a horizontal component;
   the deriving means includes first additional deriving means for deriving first additional intermediate blocks of DCT coefficients from vertically-neighboring ones of the blocks of DCT coefficients constituting the information signal;
   the matrix multiplying modules include first matrix multiplying modules in which the first additional intermediate blocks of DCT coefficients are pre-multiplied by first multiplying matrices derived from the vertical component of the linear convolution kernel to generate final blocks of DCT coefficients;
   the deriving means additionally includes:
     an additional summing module in which the final blocks of DCT coefficients generated by the first matrix multiplying modules are summed to generate second additional intermediate blocks of DCT coefficients, and
     second additional deriving means for deriving the intermediate blocks of DCT coefficients from horizontally-neighboring ones of the second additional intermediate blocks of DCT coefficients; and
   the matrix multiplying modules include second matrix multiplying modules in which the intermediate blocks of DCT coefficients are post-multiplied by second multiplying matrices derived from the horizontal component of the linear convolution kernel.

7. The implicit DST-based filter of claim 6, in which:
   the linear convolution kernel is noncausal-symmetric;
   the multiplying matrices include elements and at least half of the elements of each of the multiplying matrices have a value of zero;
   the first additional deriving means derives the first additional intermediate blocks of DCT coefficients from no more than three vertically-neighboring ones of the blocks of DCT coefficients constituting the information signal; and the second additional deriving means derives the intermediate blocks of DCT coefficients from no more than three horizontally-neighboring ones of the third additional intermediate blocks of DCT coefficients.

8. The implicit DST-based filter of claim 6, in which:

the linear convolution kernel is causal; and the first additional deriving means derives the first additional intermediate blocks of DCT coefficients from no more than two vertically-neighboring ones of the blocks of DCT coefficients constituting the information signal; and the second additional deriving means derives the intermediate blocks of DCT coefficients from no more than two horizontally-neighboring ones of the second additional intermediate blocks of DCT coefficients.

9. The implicit DST-based filter of claim 8, in which:

the linear convolution kernel is causal-symmetric; and the multiplying matrices include elements and at least half of the elements of each of the multiplying matrices have a value of zero.

10. The implicit DST-based filter of claim 6, in which the DCT coefficients in the blocks of DCT coefficients constituting the information signal have been quantized using a quantizing table, and the filter additionally comprises:

additional matrix multiplying modules in which the quantizing table is pre- and post-multiplied by additional multiplying matrices derived from the kernel matrices to generate a modified quantizing table; and an inverse quantizer that inversely quantizes the DCT coefficients in the blocks of DCT coefficients constituting the information signal using the modified quantizing table to generate the blocks of DCT coefficients from which the first additional deriving means derives the first additional intermediate blocks of DCT coefficients.

11. The implicit DST-based filter of claim 1, additionally comprising multiplying matrix generating means for generating the multiplying matrices from the linear convolution kernel, the multiplying matrix generating means including:

kernel matrix deriving means for deriving a first kernel matrix, a second kernel matrix, a third kernel matrix and a fourth kernel matrix from the linear convolution kernel;

a first matrix multiplying module in which the first kernel matrix is pre-multiplied by a sine-to-cosine transform matrix and is post-multiplied by a cosine-to-sine transform matrix to generate a first further intermediate matrix;

a second matrix multiplying module in which the second kernel matrix is post-multiplied by the cosine-to-sine transform matrix to generate a second further intermediate matrix; and a third matrix multiplying module in which the third kernel matrix is pre-multiplied by the sine-to-cosine transform matrix to generate a third further intermediate matrix.

12. The implicit DST-based filter of claim 11, in which:

the linear convolution filter is noncausal-symmetric; and the multiplying matrix generating means additionally includes:

means for multiplying the fourth kernel matrix by an integer to generate a first one of the multiplying matrices, a first summing module in which the first further intermediate matrix is subtracted from the fourth kernel matrix to generate a second one of the multiplying matrices, and a second summing module in which the second further intermediate matrix is added to the third further intermediate matrix to generate a third one of the multiplying matrices.

13. The implicit DST-based filter of claim 12, in which:

the linear convolution kernel includes a vertical component and a horizontal component;

the kernel matrix deriving means derives the first, second, third and fourth kernel matrices from the vertical component of the linear convolution kernel as first, second, third and fourth vertical kernel matrices, and additionally derives first, second, third and fourth horizontal kernel matrices from the horizontal component of the linear convolution kernel;

the first, second, and third matrix multiplying modules, the means for multiplying, and the first and second summing modules operate to generate the first, second and third multiplying matrices from the vertical kernel matrices, and additionally operate to generate three intermediate multiplying matrices from the horizontal kernel matrices; and the multiplying matrix generating means additionally includes transpose means for transposing the three intermediate multiplying matrices to generate a fourth one of the multiplying matrices, a fifth one of the multiplying matrices and a sixth one of the multiplying matrices.

14. The implicit DST-based filter of claim 12, in which the DCT coefficients in the blocks of DCT coefficients constituting the information signal have been quantized using a quantizing table, and in which:

the filter additionally comprises means for modifying the quantizing table in response to the linear convolution kernel to generate a modified quantizing table and for inversely quantizing the quantized DCT coefficients using the modified quantizing table;

the multiplying matrix generating means additionally includes simplifying means for simplifying the first one, the second one, and the third one of the multiplying matrices to generate a first, a second and a third simplified multiplying matrix, respectively, the simplifying means comprising:

means for decomposing the first one of the multiplying matrices to generate a first diagonal matrix and a second diagonal matrix, the first diagonal matrix having diagonal elements that are equal to the diagonal elements of the first one of the multiplying matrices when the diagonal elements of the first one of the multiplying matrices are non-zero, and that are otherwise equal to unity, the second diagonal matrix having diagonal elements that are equal to unity when the diagonal elements of the first one of the multiplying matrices are non-zero, and that are otherwise equal to zero, and for providing the second diagonal matrix as the first simplified multiplying matrix;

means for inverting the first diagonal matrix to generate an inverted diagonal matrix, a first matrix multiplying module for post-multiplying the second one of the multiplying matrices by the inverted diagonal matrix to generate the second simplified multiplying matrix; and a second matrix multiplying module for post-multiplying the third one of the multiplying matrices by the inverted diagonal matrix to generate the third simplified multiplying matrix; and the intermediate blocks of DCT coefficients are multiplied by the simplified multiplying matrices.

15. The implicit DST-based filter of claim 11, in which:

the linear convolution kernel is causal; and the multiplying matrix generating means additionally includes:
- a first summing module in which the third further intermediate matrix is subtracted from the fourth kernel matrix to generate a first one of the multiplying matrices, and
- a second summing module in which the first further intermediate matrix and the second further intermediate matrix are added to generate a second one of the multiplying matrices.

16. The implicit DST-based filter of claim 15, in which:

the linear convolution kernel includes a vertical component and a horizontal component;

the kernel matrix deriving means derives the first, second, third and fourth kernel matrices from the vertical component of the linear convolution kernel as first, second, third and fourth vertical kernel matrices, and additionally derives first, second, third and fourth horizontal kernel matrices from the horizontal component of the linear convolution kernel;

the first, second, and third matrix multiplying modules, the means for multiplying and the first and second summing modules operate to generate the first and second multiplying matrices from the vertical kernel matrices, and additionally operate to generate two intermediate multiplying matrices from the horizontal kernel matrices; and the multiplying matrix generating means additionally includes transpose means for transposing the two intermediate multiplying matrices to generate a third one of the multiplying matrices and a fourth one of the multiplying matrices.

17. The implicit DST-based filter of claim 15, in which the DCT coefficients in the blocks of DCT coefficients constituting the information signal have been quantized using a quantizing table, and in which:

the filter additionally comprises means for modifying the quantizing table in response to the linear convolution kernel to generate a modified quantizing table and for inversely quantizing the quantized DCT coefficients using the modified quantizing table;

the multiplying matrix generating means additionally includes simplifying means for simplifying the first one and the second one of the multiplying matrices to generate a first and a second simplified multiplying matrix, respectively, the simplifying means comprising:
- means for combining the first and second ones of the multiplying matrices to generate a combined multiplying matrix, the combined multiplying matrix being a diagonal matrix whose odd diagonal elements are equal to the odd diagonal elements of the first one of the multiplying matrices and whose even diagonal elements are equal to the even diagonal elements of the second one of the multiplying matrices,
- means for decomposing the combined multiplying matrix to generate a diagonal matrix having diagonal elements that are equal to the diagonal elements of the combined multiplying matrix when the diagonal elements of the combined multiplying matrix are non-zero, and that are otherwise equal to unity,
- means for inverting the diagonal matrix to generate an inverted diagonal matrix,
- a first matrix multiplying module for post-multiplying the first one of the multiplying matrices by the inverted diagonal matrix to generate the first simplified multiplying matrix, and
- a second matrix multiplying module for post-multiplying the second one of the multiplying matrices by the inverted diagonal matrix to generate the second simplified multiplying matrix; and the intermediate blocks of DCT coefficients are multiplied by the simplified multiplying matrices.

18. The implicit DST-based filter of claim 11, in which the DCT coefficients in the blocks of DCT coefficients constituting the information signal have been quantized using a quantizing table, and in which:

the linear convolution kernel includes a vertical component and a horizontal component;

the multiplying matrix generating means generates a vertical multiplying matrix in response to the vertical component of the linear convolution component and a horizontal multiplying matrix in response to the horizontal component of the linear convolution component; and the multiplying matrix generating means additionally includes:
- means for decomposing the vertical multiplying matrix to generate a vertical diagonal matrix having diagonal elements that are equal to the diagonal elements of the vertical multiplying matrix when the diagonal elements of the vertical multiplying matrix are non-zero, and that are otherwise equal to unity, and for decomposing the horizontal multiplying matrix to generate a horizontal diagonal matrix having diagonal elements that are equal to the diagonal elements of the horizontal multiplying matrix when the diagonal elements of the horizontal multiplying matrix are non-zero, and that are otherwise equal to unity, and
- a matrix multiplying module in which the quantizing table is pre-multiplied by the vertical diagonal matrix and post-multiplied by the horizontal diagonal matrix to generate a modified quantizing table.

19. The implicit DST-based filter of claim 11, in which the kernel matrix deriving means additionally includes:

means for performing a discrete Fourier transform on a vector that exactly represents the linear convolution kernel to generate a set of transform coefficients;

means for generating a first vector, a second vector, a third vector, and a fourth vector by selecting subsets of the set of transform coefficients;

means for generating the fourth kernel matrix and the first kernel matrix, the kernel matrices respectively having the first vector and the second vector as diagonal elements thereof;

means for generating a first intermediate matrix and a second intermediate matrix, the first and second intermediate matrices respectively having the third vector and the fourth vector as diagonal elements thereof; and a matrix multiplying module in which the first intermediate matrix is post-multiplied by a matrix $\Theta$ to generate the second kernel matrix, and the second intermediate matrix is post-multiplied by a transpose of the matrix $\Theta$ to generate the third kernel matrix, the matrix $\Theta$ being defined as:

$$\Theta = \begin{pmatrix} 0 & 0 & 0 & 0 & 0 & 0 & 0 & 0 \\ 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \end{pmatrix}.$$

20. The implicit DST-based filter of claim 1, in which:
the neighboring ones of the blocks of DCT coefficients constituting the information signal are organized as:

$$X^c_{NW} \quad X^c_N \quad X^c_{NE}$$
$$X^c_W \quad X^c \quad X^c_E$$
$$X^c_{SW} \quad X^c_S \quad X^c_{SE};$$

the linear convolution kernel is noncausal-symmetric;
each of the matrix multiplying modules generates an output block of DCT coefficients by multiplying one of the intermediate blocks of the DCT coefficients; and
the deriving means includes a first processing module, comprising:
   a path through which the block $X^c_E$ passes to a first one of the matrix multiplying modules,
   a first summing module having an output connected to a second one of the matrix multiplying modules, the summing module having a positive input and a negative input,
   two summing modules in a butterfly arrangement connected in series with two even-element sign reversing modules to form a serial arrangement having a positive input, a negative input, a positive output and a negative output, the serial arrangement being connected to receive the blocks $X^c_{SE}$ and $X^c_{NE}$ at the negative input and the positive input, respectively, and to supply a block of sign-reversed, differenced DCT coefficients to the third one of the matrix multiplying modules from the negative output and a block of sign-reversed, summed DCT coefficients to the negative input of the first summing module from the positive output,
   a doubling module connected to receive the block $X^c_E$ and supplying a block of doubled DCT coefficients to the positive input of the first summing module, and
   a third summing module having a positive input and two negative inputs to which outputs of the first one, the second one and the third one of the matrix multiplying modules are respectively connected, the third summing module generating a block $Z^c_E$ of DCT coefficients.

21. The implicit DST-based filter of claim 20, in which the deriving means additionally comprises:
serially-connected first and second delay modules connected to receive successive ones of the blocks of DCT coefficients generated by the first processing module and to generate blocks $Z^c$ and $Z^c_W$ by successively delaying the block $Z^c_E$; and
a second processing module, similar to the first processing module, connected to receive the block $Z^c_E$ from the first processing module and the blocks $Z^c$ and $Z^c_W$ from the first and second delay modules, respectively, the second processing module processing the blocks $Z^c_E$, $Z^c$, and $Z^c_W$ to generate a block $Y^c$ of DCT coefficients as one of the blocks of the filtered information signal.

22. The implicit DST-based filter of claim 20, in which the DCT coefficients in the blocks of DCT coefficients constituting the information signal have been quantized using a quantizing table, and in which:
the filter additionally comprises:
   additional matrix multiplying modules in which the quantizing table is pre- and post-multiplied by the additional multiplying matrices derived from the kernel matrices to generate a modified quantizing table, and
   an inverse quantizer that inversely quantizes the DCT coefficients in the blocks of DCT coefficients constituting the information signal using the modified quantizing table to generate respective blocks of dequantized DCT coefficients, the blocks of dequantized DCT coefficients including blocks $\tilde{X}^c_{NE}$, $\tilde{X}^c_E$ and $\tilde{X}^c_{SE}$;
the first processing module receives and processes a block $\tilde{X}^c_{NE}$ in lieu of the block $X^c_{NE}$, a block $\tilde{X}^c_E$ in lieu of the block $X^c_E$, and a block $\tilde{X}^c_{SE}$ in lieu of the block $X^c_{SE}$; and
the third summing module generates a block $\tilde{Z}^c_E$ of DCT coefficients.

23. The implicit DST-based filter of claim 1, in which:
the neighboring ones of the blocks of DCT transform coefficients constituting the information signal are organized as:

$$X^c_{NW} \quad X^c_N \quad X^c_{NE}$$
$$X^c_W \quad X^c \quad X^c_E$$
$$X^c_{SW} \quad X^c_S \quad X^c_{SE};$$

the linear convolution kernel is causal;
each of the matrix multiplying modules generates an output block of DCT coefficients in response to one of the intermediate blocks of DCT coefficients; and
the deriving means includes a first processing module, comprising:
   two summing modules in a butterfly arrangement connected in series with an even-element sign reversing module to form a serial arrangement having a positive input, a negative input, a positive output and a negative output, the serial arrangement being connected to receive the blocks $X^c_N$ and $X^c$ at the negative input and the positive input, respectively, and to supply a block of sign-reversed, differenced DCT coefficients to a third one of the matrix multiplying modules from the negative output and a block of sign-reversed, summed DCT coefficients to a second one of the matrix multiplying modules from the positive output, and
   a third summing module having positive inputs to which outputs of the first and second ones of the matrix multiplying modules are respectively connected, the second summing module generating a block $Z^c$ of DCT coefficients.

24. The implicit DST-based filter of claim 23, in which the deriving means additionally comprises:

a delay module connected to receive successive ones of the blocks of DCT coefficients generated by the first processing module and to generate a block $Z^c_W$ corresponding to the block $Z^c$; and a second processing module, similar to the first processing module, connected to receive the block $Z^c$ from the first processing module and the block $Z^c_W$ from the delay modules, the second processing module processing the blocks $Z^c$ and $Z^c_W$ to generate a block $Y^c$ of DCT coefficients as one of the blocks of the filtered information signal.

25. The implicit DST-based filter of claim 23, in which the DCT coefficients in the blocks of DCT coefficients constituting the information signal have been quantized using a quantizing table, and in which:

the filter additionally comprises:

additional matrix multiplying modules in which the quantizing table is pre- and post-multiplied by the additional multiplying matrices derived from the kernel matrices to generate a modified quantizing table, and an inverse quantizer that inversely quantizes the DCT coefficients in the blocks of DCT coefficients constituting the information signal using the modified quantizing table to generate blocks of dequantized DCT coefficients, the blocks of dequantized DCT coefficients including blocks $\tilde{X}^c_N$ and $\tilde{X}^c$, the first processing module receives and processes the block $\tilde{X}^c_N$ in lieu of the block $X^c_N$, and the block $\tilde{X}^c$ in lieu of the block $X^c$; and the third summing module generating a block $\tilde{Z}^c_E$ of DCT coefficients.

\* \* \* \* \*